US011211945B1

(12) United States Patent
Lo et al.

(10) Patent No.: US 11,211,945 B1
(45) Date of Patent: Dec. 28, 2021

(54) PARALLELIZED DECODING OF VARIABLE-LENGTH PREFIX CODES

(71) Applicant: Microsoft Technology Licensing, LLC, Redmond, WA (US)

(72) Inventors: Daniel Lo, Bothell, WA (US); Blake D Pelton, Redmond, WA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 0 days.

(21) Appl. No.: 17/084,169

(22) Filed: Oct. 29, 2020

(51) Int. Cl.
*H03M 7/40* (2006.01)
*H03M 7/30* (2006.01)

(52) U.S. Cl.
CPC .......... *H03M 7/6023* (2013.01); *H03M 7/40* (2013.01); *H03M 7/6005* (2013.01)

(58) Field of Classification Search
CPC .... H03M 7/6023; H03M 7/40; H03M 7/6005; H03M 7/4031
USPC .......................................................... 341/67
See application file for complete search history.

(56) References Cited

U.S. PATENT DOCUMENTS

| | | | | |
|---|---|---|---|---|
| 5,617,089 A | * | 4/1997 | Kinouchi | G06T 9/005 341/63 |
| 5,675,331 A | * | 10/1997 | Watanabe | H03M 7/425 341/67 |
| 6,414,875 B2 | * | 7/2002 | Rolandi | G11C 8/10 365/185.05 |
| 6,653,955 B1 | * | 11/2003 | Yang | H03M 7/40 341/50 |
| 8,700,979 B2 | * | 4/2014 | Arai | H04L 1/0071 714/794 |
| 2003/0210163 A1 | * | 11/2003 | Yang | H03M 7/40 341/67 |

OTHER PUBLICATIONS

Deutsch, P, "DEFLATE Compressed Data Format Specification version 1.3", Retrieved from: https://tools.ietf.org/html/rfc1951, May 1996, 15 Pages.

* cited by examiner

*Primary Examiner* — Jean B Jeanglaude
(74) *Attorney, Agent, or Firm* — Fiala & Weaver P.L.L.C.

(57) ABSTRACT

Methods and systems are provided for decoding variable-length codes in a parallel process. A stream of variable-length code words is divided into fixed length words. A plurality of parallel sets of decoder circuits each receive, in parallel, a current fixed length word and a prior fixed length word. Each decoder circuit has a respective fixed leftover bit-count. Each decoder circuit generates a respective output that may include a decoded symbol and a new leftover bit-count. Each respective output is determined based on the respective current fixed length word, the respective prior fixed length word, and the respective fixed leftover bit-count. A set of selected decoder circuit outputs is generated for each set of the parallel sets of decoder circuits based on a set of first leftover bit-counts. One output from each set of selected decoder circuit outputs is selected as a final output based on a second prior leftover bit-count.

20 Claims, 7 Drawing Sheets

PARALLELIZED DECODING OF VARIABLE-LENGTH PREFIX CODES

BACKGROUND

Prefix codes comprise variable-length code words and are often used in compression algorithms to compress data (e.g., DEFLATE). Huffman coding is a type of prefix code that enables lossless data compression using a variable number of bits per symbol. Prefix codes comprise a "prefix property," which specifies that no whole code word in the system is a prefix of any other code word in the system. For example, the code words {0, 101, 110} comprise a prefix code system, whereas {1, 101, 110} is not a prefix code system because 1 is a prefix of 101 and 110. Prefix coding allows messages to be sent as a sequence of concatenated prefix code words without using out-of-band or special markers between words to frame the words in the message. Based on the prefix property, a recipient can easily decode the message by repeatedly finding sequences that form valid code words.

SUMMARY

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods and systems are provided for decoding variable-length codes in a parallel process. A stream of variable-length code words is divided into a series of fixed length words. Each of the fixed length words comprises at least a portion of an encoded symbol. At a first set of decoder circuits, a first fixed length word and a first prior fixed length word from the series of fixed length words are received. Each decoder circuit of the first set of decoder circuits has a respective fixed leftover bit-count. Each decoder circuit of the first set of decoder circuits generates a respective output comprising a decoding result and a new leftover bit-count. Each respective output is determined based on the first fixed length word, the first prior fixed length word, and the respective fixed leftover bit-count. A set of selected decoder circuit outputs is generated by selecting outputs of the first set of decoder circuits, based on a set of first leftover bit-counts of a second set of decoder circuits. One decoder circuit output of the set of selected decoder circuit outputs is selected based on a second leftover bit-count of a third set of decoder circuits. The decoding result and the new leftover bit-count correspond to the selected decoder circuit output.

Further features and advantages of embodiments, as well as the structure and operation of various embodiments, are described in detail below with reference to the accompanying drawings. It is noted that the methods and systems are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form a part of the specification, illustrate embodiments of the present application and, together with the description, further serve to explain the principles of the embodiments and to enable a person skilled in the pertinent art to make and use the embodiments.

Figure 1:
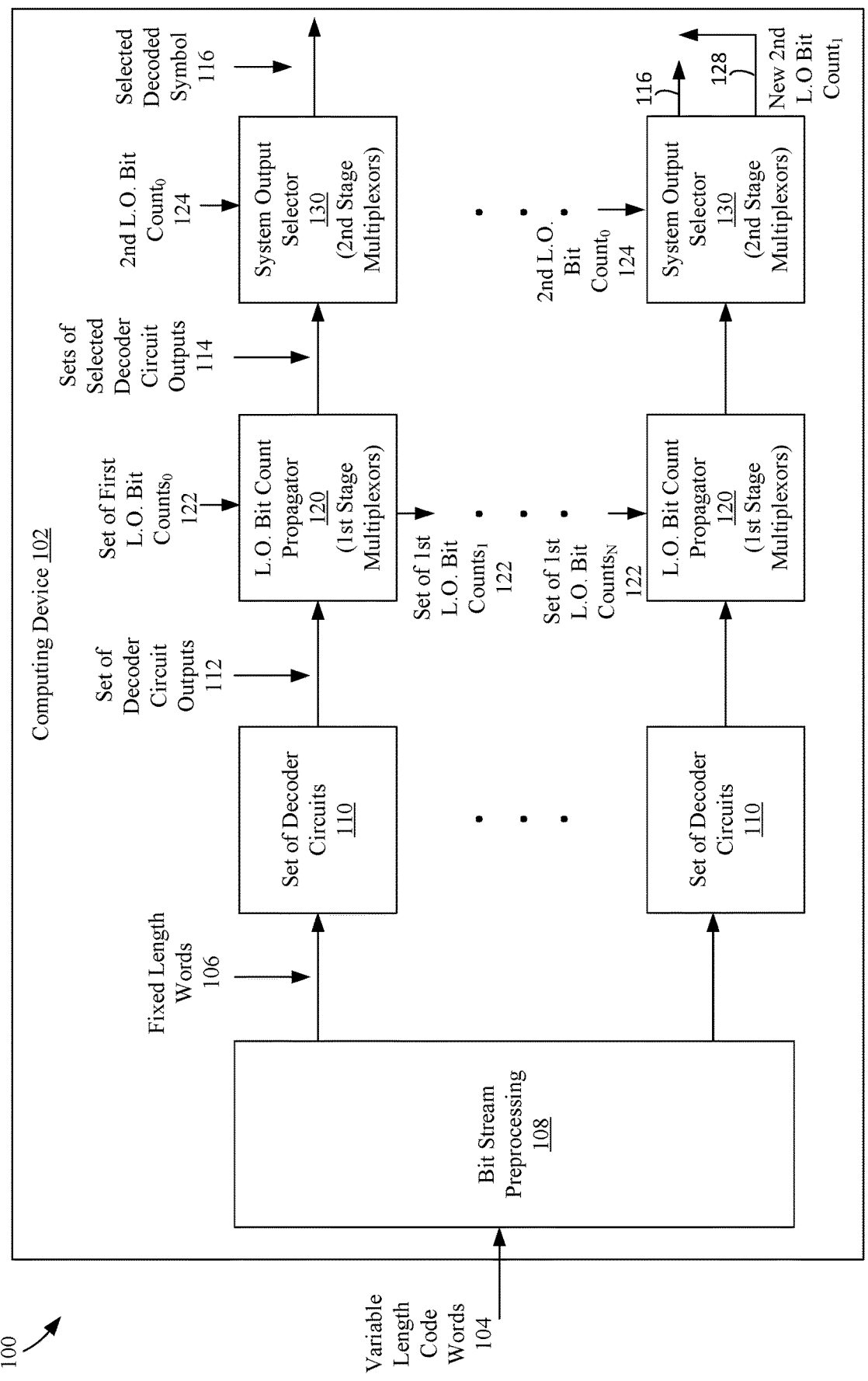
FIG. 1 is a block diagram of a pipelined parallel processing system for decoding variable length code words, according to an example embodiment.

The features and advantages of the embodiments described herein will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification and accompanying drawings disclose one or more embodiments that incorporate the features of the disclosed embodiments. The scope of the embodiments is not limited only to the aspects disclosed herein. The disclosed embodiments merely exemplify the intended scope, and modified versions of the disclosed embodiments are also encompassed. Embodiments are defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which it is intended.

Numerous exemplary embodiments are described as follows. It is noted that any section/subsection headings provided herein are not intended to be limiting. Embodiments are described throughout this document, and any type of embodiment may be included under any section/subsection. Furthermore, embodiments disclosed in any section/subsection may be combined with any other embodiments described in the same section/subsection and/or a different section/subsection in any manner.

II. Example Embodiments

1. Overview

Prefix codes (e.g., Huffman coding) use a variable-length code to compress data. As described above, prefix codes comprise a "prefix property," which specifies that no whole code word in the system is a prefix of any other code word in the system. Prefix coding allows messages to be sent as a sequence of concatenated prefix code words without using out-of-band or special markers between words to frame the words in the message. Based on the prefix property, a recipient can easily decode the message by repeatedly finding sequences that form valid code words. Although the a stream of prefix codes may be easily decoded by serially detecting each code word, the variable length words of prefix codes are difficult to parallelize in a decoding process, because the boundaries of each codeword are not known to the decoder system. Methods and systems are provided herein to parallelize decoding of variable length code words by first preprocessing a stream of prefix code words to generate a series of fixed width code words and decoding the fixed width code words using parallel decoder circuits and subsequent stages of leftover bit propagation. This method allows parallelized, high-throughput decoding of prefix codes. The methods and systems described herein provide a way to execute Huffman decoding in a pipeline parallel fashion with reduced cycles per decoded symbol.

Table 1 (below) includes a prefix (Huffman) code from section 3.2.2 of the Deflate Request for Comments (RFC) 1951.

TABLE 1

Prefix Code with Variable Length Code Words

| Symbol | Length | Code |
|--------|--------|------|
| A | 3 | 010 |
| B | 3 | 011 |
| C | 3 | 100 |
| D | 3 | 101 |
| E | 3 | 110 |
| F | 2 | 00 |
| G | 4 | 1110 |
| H | 4 | 1111 |

The encoded bit stream 010011001111 comprises a series of concatenated variable length code words from Table 1, which decode to the symbols ABFH. It is difficult to parallelize the decoding of this bit stream because the number of bits in different encoded symbols is different (e.g., 3 bits, 3 bits, 2 bits, and 4 bits respectively). To enable a parallel decoding process, the encoded bit stream is first split into chunks to create input words of equal length fixed word widths. This parameter enables trading hardware resources for throughput to provide a more efficient decoding process. In one example, the chunks include 4 bits per input word, for example, {0100 1100 1111}. A 4 bit word may comprise a variable number of encoded symbols. Some encoded symbols span the boundaries between the fixed length words, and as such, may be referred to as spanning symbols. Each fixed length input word may be processed in a pipeline. For each fixed length input word, the respective pipeline may generate a set of symbols that can be decoded by the bits of the word and/or prior spanning symbols. The pipeline may also generate the number of remaining bits for any spanning symbol bits that may span the current word and the next word after decoding the current word. Moreover, the decoding pipeline may generate a mapping from the absolute position of the previously fully decoded symbol (e.g., after decoding all previous input words), to the absolute position of a fully decoded symbol in the current input word (e.g., after decoding the current input word). In this regard, the hardware in the pipeline has access to enough bits from previous input words to compute the mapping table. Alternatively, the mapping generated by the decoding pipeline may comprise a mapping of the number of leftover bits, after decoding a prior fully decoded symbol, to the number of leftover bits after decoding the current fully decoded symbol.

Table 2 (below) is an example of a mapping table computed for the third word {1111} as the word currently being decoded and {0100 1100} as prior words of the three fixed width input words {0100 1100 1111}, with respect to the encoded symbols shown in Table 1.

TABLE 2

Mapping Counts of Fully Decoded Bits Before and After Decoding a Current Word

| Count of Fully Decoded Bits Before Decoding the Current Word | Undecoded Bits of Prior Word, Current Input Word | Decoded Symbol, Current Undecoded Bits (binary number) | Count of Fully Decoded Bits After Decoding the Current Word |
|---|---|---|---|
| 5 | 100, 1111 | N/A (100 is decodable) | N/A (invalid input) |
| 6 | 00, 1111 | N/A (00 is decodable) | N/A (invalid input) |
| 7 | 0, 1111 | B, 11 | 10 |
| 8 | 1111 | H (no current leftover bits) | 12 |

A table generated by a decoding pipeline may include only the first and last columns of Table 2. The middle two columns are included (above) to illustrate how the last column is generated. In this example, inputs 5 and 6 of the first column are invalid because they correspond to prior undecoded bits (i.e., leftover bits) of 100 and 00 respectively, which fully decode to symbols C and F. Therefore, these two cases would not yield leftover bits and may be considered invalid input.

With reference to Table 2, it can be understood that instead of using the count of fully decoded bits in the mapping table, counts of undecoded (i.e., leftover bits) may be mapped in the table. For example, in the third row of Table 2, 7 fully decoded bits before decoding the current word {1111} can also be expressed as a count of 1 leftover bit after decoding the two prior words {0100 1100}. Also, a count of 10 fully decoded bits after decoding the current word 111111 can be represented as having 2 leftover bits after decoding the current word {1111}. Similarly, for the last row, 8 fully decoded bits before decoding the current word 111111 can also be expressed as a count of 0 leftover bits after decoding the two prior words {0100 1100}. Also, a count of 12 fully decoded bits after decoding the current word {1111} can be represented as 0 leftover bits after decoding the current word.

A table propagation process may be performed in a stage of a decoder pipeline where an index to the table is the actual count of prior leftover bits (or the count of fully decoded bits, depending on which counts are used in the mapping table). A count of prior leftover bits is determined or known before the first word in the pipeline is processed. After generating the mapping, there is a pipeline stage with feedback. In that pipeline stage, the hardware has access to the true count of prior undecoded bits. The mapping table may be used to determine a new count of undecoded bits. After this pipeline stage, the hardware can determine a set of decoded symbols based on the new count of undecoded bits. A final output comprising a decoded symbol may be selected based on a further prior count of undecoded bits.

It is not necessary for the prefix code decoding pipeline to speculatively execute the full decoding process in order to compute the mapping table. All that is needed are symbol lengths, not symbol values. If the Huffman tree is represented as per the Deflate RFC 1951, then determining encoded symbol lengths is much easier than determining actual decoded symbol values. This stems from a property that provides, for a given symbol length, all of the symbols of that length occupy a contiguous set of encoded values. As described in more detail below, the mapping table may be implemented as a lookup table, or as a multiplexor.

In general, the performance of decoder circuits may be limited because of the dependence, of decoding each input code word, on the count of leftover bits from decoding a preceding code word. For table-based decoder circuits, this performance may be limited due to the time consuming table lookup for each iteration of decoding a code word. In addition, this dependence makes it difficult to parallelize across inputs.

The embodiments disclosed herein provide for an improvement in the performance of table-based decoder systems by reducing the critical dependence path and providing a way to parallelize across inputs, which does not increase this dependence path. In this regard, current decoded symbol and current leftover bit-count entries for all possible prior leftover bit-counts are read from the decoder table for a given current input code word. The correct current decoded symbol and current count of leftover bits output is then selected from these entrees, based on the count of bits leftover from decoding the preceding input code word (i.e., the prior leftover bit-count). The table read is now no longer dependent on the prior leftover bit-count, removing it from the dependence path, and allowing it to be pipelined. Furthermore, propagating the output from the decoder table allows for parallelizing across inputs. In other words, the present disclosure improves prefix code decoding by decreasing the dependence path and allowing parallelization across inputs for table-based decoder circuits. This allows the decoder circuits to achieve a higher throughput through better performance per input (e.g., a lower iteration interval, fewer or faster clock cycles) and decoding multiple code word inputs per iteration.

FIG. 1 is a block diagram of a pipelined parallel processing system 100 for decoding variable length code words, according to an example embodiment. As shown in FIG. 1, system 100 comprises computing device 102. Computing device 102 includes a bit stream preprocessor 108, a plurality of sets of decoder circuits 110, a plurality of leftover bit-count propagators 120, and a plurality of system output selectors 130. These features of system 100 are described in further detail as follows.

Referring to FIG. 1, computing device 102 may comprise any suitable computing device, such as a stationary computing device (e.g., a desktop computer or personal computer), a mobile computing device (e.g., a Microsoft® Surface® device, a personal digital assistant (PDA), a laptop computer, a notebook computer, a tablet computer such as an Apple iPad™, a netbook, etc.), a mobile phone (e.g., a cell phone, a smart phone such as an Apple iPhone, a phone implementing the Google® Android™ operating system, a Microsoft Windows® phone, etc.), a wearable computing device (e.g., a head-mounted device including smart glasses such as Google® Glass™, Oculus Rift® by Oculus VR, LLC, etc.), a gaming console/system (e.g., Nintendo Switch®, etc.), an appliance, a set top box, etc.

Bit stream preprocessor 108 is configured to receive and process a series of variable length code words 104 such as prefix codes. The variable length code words 104 may comprise symbols encoded based on Huffman coding. The series of variable length code words 104 may be concatenated or received as a bit stream. Bit stream preprocessor 108 is configured to divide the series of variable length code words 104 into a series of fixed length words 106 (i.e., chunks) where each fixed length word 106 has the same number of bits. Bit stream preprocessor 108 is coupled to the sets of decoder circuits 110 and is configured to output the fixed length words 106, which are received by the plurality of sets of decoder circuits 110.

System 100 includes a plurality of parallel pipelines where each pipeline decodes one fixed length word 106 of the series of fixed length words 106. Each pipeline includes a set of decoder circuits 110, a leftover bit-count propagator 120, and a system output selector 130. In other words, following bit stream preprocessor 108, there are three parallel stages of processing including a decoding stage, a leftover bit-count propagator stage (also referred to as a first stage of multiplexors), and an output selector stage (also referred to as second stage multiplexors). The stage comprising the plurality of sets of decoder circuits 110 is configured to output multiple candidate decoding results for a particular fixed length word 106, the stage comprising leftover bit-count propagators 120 is configured to select a subset of the multiple candidate outputs, and the stage of system output selectors 130 is configured to select one of the subset of candidate outputs, and output a final decoded symbol and a leftover bit-count based on the selection. During one decoding iteration, fixed length words 106 are received by the parallel decoder circuits, processed by the stages of each pipeline, and decoded symbols and/or second leftover bit counts are output by system output selectors 130.

Each decoder circuit in a set of decoder circuits 110 is associated with a respective fixed leftover bit-count. Each decoder circuit of plurality of sets of decoder circuits 110 comprises suitable logic, circuitry, interfaces, and/or code configured to receive and decode a fixed length word 106 and generate a respective output 112 that is a candidate decoder circuit output. The respective output 112 is generated based on the decoder circuit's respective fixed leftover bit-count. Each respective output 112 is a candidate for selection in a later stage of the pipeline, and may include one or more decoded symbols and a new count of undecoded bits that are also candidates for selection in a later stage of the pipeline. The new undecoded bits are bits leftover after decoding the respective fixed length word 106 combined with prior undecoded bits according to the respective fixed leftover bit-count. When a decoder circuit receives an input having bits that do not include a full encoded symbol, the decoder circuit may output a new leftover bit count and a decoding result that does not include a decoded symbol. The new leftover bit-count increases based on the number of undecoded bits of the input. Eventually, an input word plus the prior undecoded bits may include all the bits of an encoded symbol, and the encoding result in the output includes the decoded symbol. In some embodiments, sets of decoder circuits 110 utilize look-up tables that are configured for decoding the fixed length words 106 and generating respective new leftover bit-counts. In some embodiments, each decoder circuit of the plurality of sets of decoder circuits 110 comprises suitable logic, circuitry, interfaces, code and/or data configured to decode the fixed length words 106 and/or generate the new leftover bit-counts.

Each of the parallel leftover bit-count propagators 120 may be coupled to a respective set of decoder circuits 110 in a prior stage of the same pipeline. Moreover, each of the parallel leftover bit-count propagators 120 may be coupled to a parallel leftover bit-count propagator 120 of a pipeline that decodes a prior fixed length word 106, and/or a parallel leftover bit-count propagator 120 of a pipeline that decodes a subsequent fixed length word 106.

Each of the parallel leftover bit-count propagators 120 may comprise suitable logic, circuitry, interfaces, code and/or data that is configured to select a subset of the set of decoder circuit outputs 112 generated by its respective set of decoder circuits 110 based on a set of first leftover bit-counts 122 received from the parallel leftover bit-count propagator 120 of the pipeline that decodes the preceding fixed length word 106. Each leftover bit-count propagator 120 outputs a respective set of selected decoder circuit outputs 114 that are selected from a respective set of decoder circuit outputs 112, and is configured to transmit the respective set of selected decoder circuit outputs 114 to a respective system output selector 130 that is the next stage in the same pipeline. Moreover, each of the leftover bit-count propagators 120 is configured to transmit respective first leftover bit counts 122 from the respective set of selected decoder circuit outputs 114 to a parallel leftover bit-count propagator 120 that processes a subsequent fixed length word 106. In other words, each of the parallel leftover bit-count propagators 120 is configured to transmit its respective set of first counts of undecoded bits to a leftover bit-count propagator 120 in parallel pipeline that processes a subsequent fixed length word 106.

Each of the system output selectors 130 may comprise suitable logic, circuitry, interfaces, code and/or data that are configured to receive a respective set of selected decoder circuit outputs 114 from respective leftover bit-count propagators 120 in the preceding stage of the same pipeline, and select one output of the set of selected decoder circuit outputs 114 based on a second leftover bit-count 124 generated by a system output selector 130 in a pipeline that decodes a previous fixed length word, where the previous fixed length word may be an immediate previous fixed length word or an earlier previous fixed length word. The selected one output of the set of selected decoder circuit outputs 114 may comprise a selected decoded symbol 116 and/or a new second leftover bit-count 128 generated by a decoder circuit of the set of decoder circuits 110 in a prior stage of the same pipeline. The system output selector 130 of the last pipeline may transmit the new second leftover bit-count 128 from the selected output as a new second leftover bit-count to be used in the system output selectors 130 when processing (decoding and selecting) a subsequent set of fixed length words 106. In this manner, the performance of prefix code decoding is improved by decreasing the dependence path and allowing parallelization across inputs for table-based decoder circuits. This allows the decoder circuits to achieve a higher throughput per input (e.g., a lower iteration interval, fewer or faster clock cycles) and decoding multiple parallel code word inputs per iteration.

These and further embodiments for decoding variable length code words in a pipelined parallel processing system may be implemented in various ways. For example, FIGS. 2 and 3 comprise schematic diagrams of a pipelined parallel processing system 200 for decoding variable length code words, according to an example embodiment.

Figure 2:
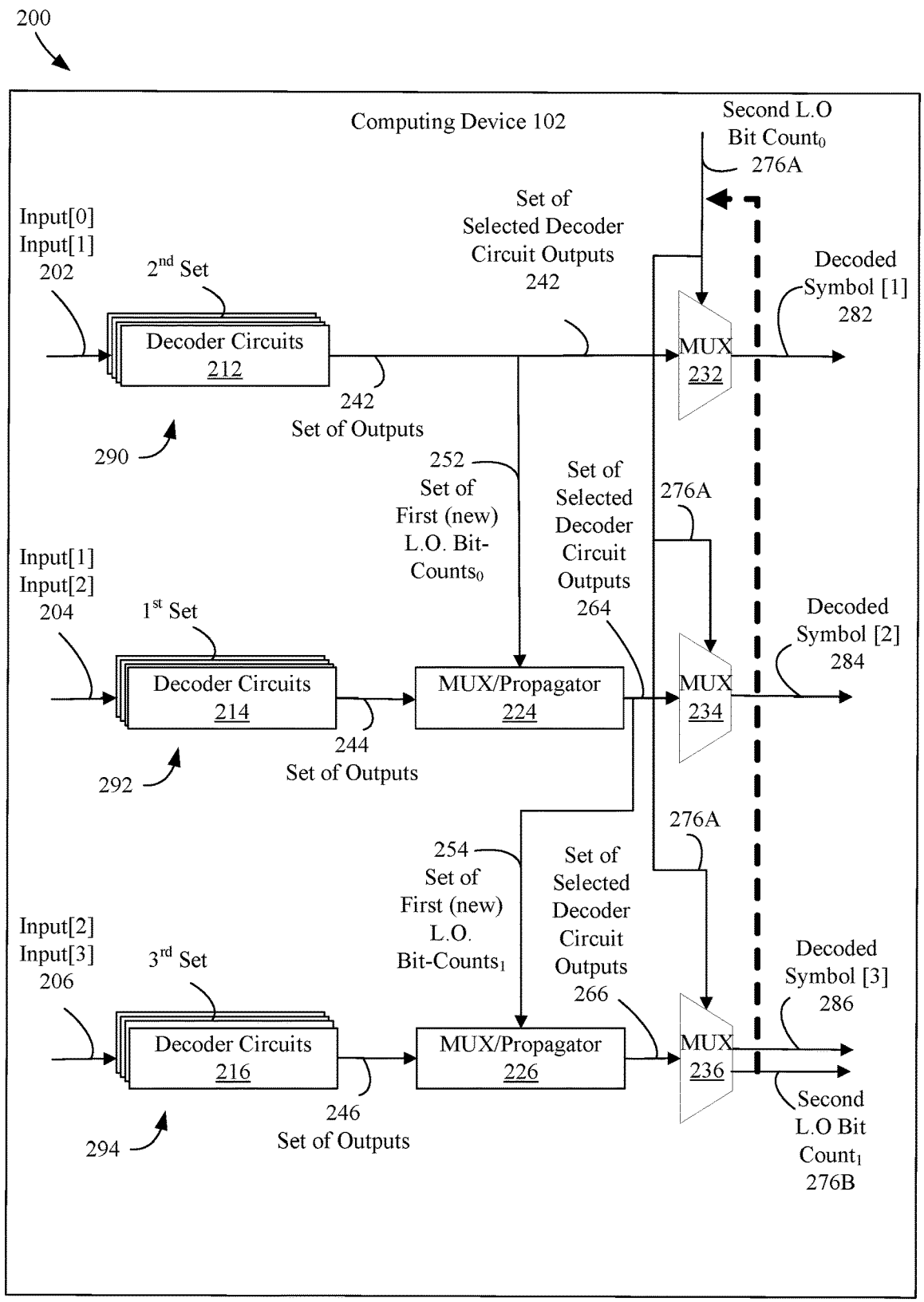
FIG. 2 is a schematic diagram of a pipelined parallel processing system for decoding variable length code words, according to an example embodiment.
Figure 3:
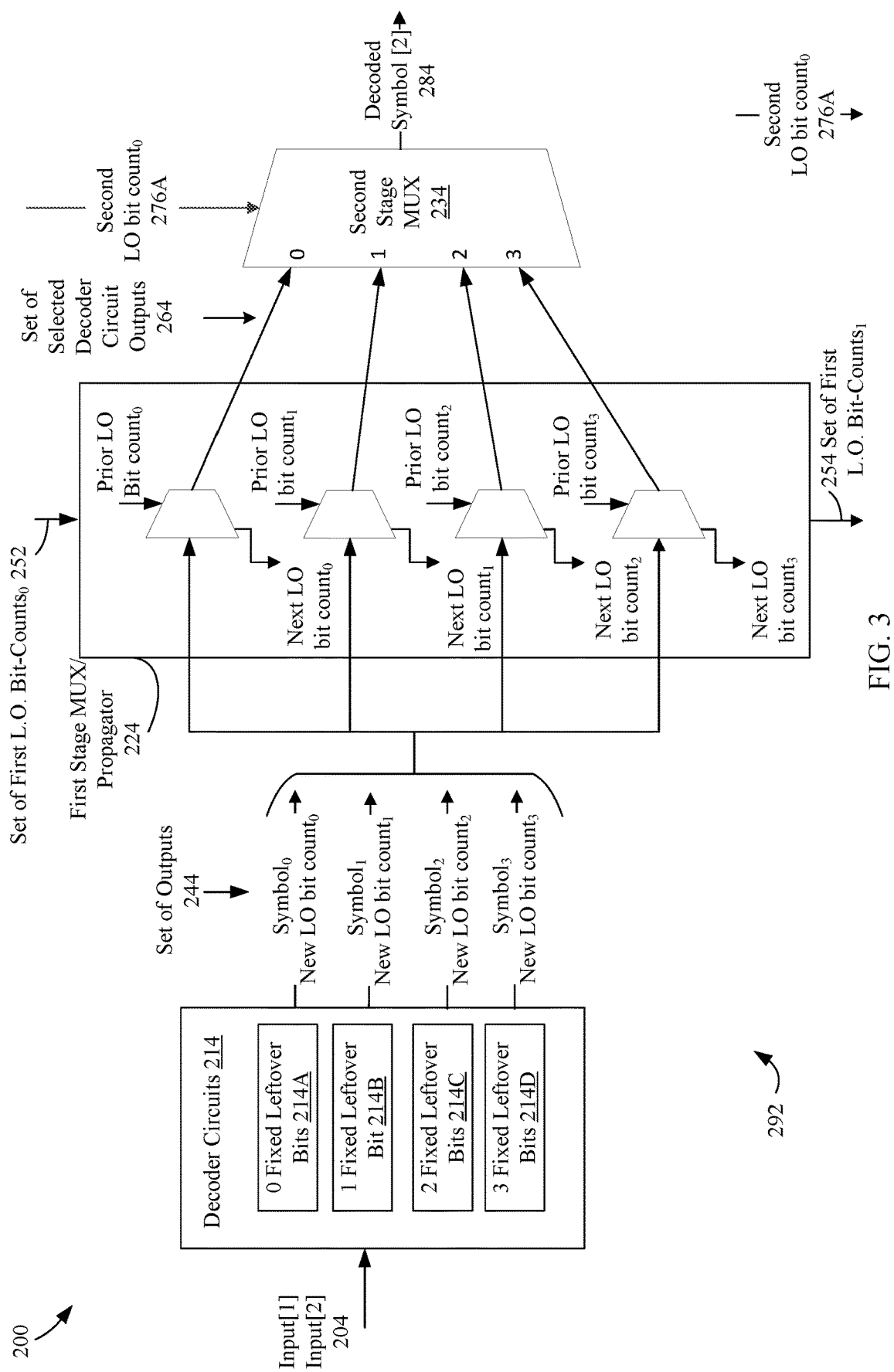
FIG. 3 is a schematic diagram showing a leftover bit propagation stage in a pipelined parallel processing system for decoding variable length code words, according to an example embodiment.

As shown in FIGS. 2 and 3, system 200 includes computing device 102, first-third sets of decoder circuits 212, 214, and 216, first and second leftover bit-count propagators 224 and 226, and first-third system output selectors 232, 234, and 236. Set of decoder circuits 214 includes first-fourth decoder circuits 214A, 214B, 214C, and 214D. Also shown in FIGS. 2 and 3 are first-third input words 202, 204, and 206, first-third sets of decoder circuit outputs 242, 244, and 246, a set of first leftover bit counts 252, a set of first leftover bit counts 254, first and second sets of selected decoder circuit outputs 264 and 266, a second leftover bit-count 276A, a second leftover bit-count 276B, first-third decoded symbols 282, 284, and 286, and first-third pipelines 292, 294, and 296. The embodiments of system 200 of FIGS. 2 and 3 are described in further detail as follows.

Although bit stream preprocessor 108 is not shown in FIG. 2, bit stream preprocessor 108 is configured to generate fixed length words of input words 202, 204, and 206. Bit stream preprocessor 108 is configured to divide a series of variable length code words 104 (e.g., prefix codes) into a series of fixed length words, where each fixed length word has the same number of bits. Bit stream preprocessor 108 is coupled to sets of parallel decoder circuits 212, 214, and 216, and is configured to output a series of fixed length words such as input[0], input[1], input[2], and input [3], for input to the sets of decoder circuits 212, 214, and 216 in input words 202, 204, and 206. The bits of input[0] precede the bits of input[1] in the stream of variable length code words 104. Similarly, the bits of input[1] precede the bits of input[2] in the stream of variable length code words 104, and so on for the bits of input[2] to the bits of input[3], and the bits of input[3] to the bits of input[4]. As shown in FIG. 2, input words 202 comprise fixed length code words input[0] and input[1], input words 202 comprise fixed length code words input[1] and input[2], and input words 206 comprise fixed length code words input[2] and input[3].

As shown in FIG. 2, system 200 includes three parallel decoder pipelines 292, 294, and 296. Each of the pipelines may receive an input to be decoded during an input cycle of a decoding iteration and may process the input through the stages of the pipeline over a number of time cycles until a decoded symbol is output from the last stage. Although the pipelines 292, 294, and 296 are parallel pipelines, a pipeline that processes a fixed length word(s) that precedes (in the series of fixed length words) a fixed length word(s) processed by another parallel pipeline, may be referred to as a prior parallel pipeline. For example, even though pipelines 290, 292, and 294 may receive their respective inputs during the same or similar input time cycle, pipeline 290 may be referred to as a prior parallel pipeline relative to pipeline 292, and pipeline 292 may be referred to as a prior parallel pipeline relative to pipeline 294, or pipeline 294 may be referred to as following parallel pipeline 292. Moreover, although only three pipelines are shown in system 200, the disclosure is not limited in this regard and any suitable number of pipelines may be configured in system 200. For example, one or more additional pipelines similar or substantially the same as pipeline 292 may be configured between pipeline 292 and pipeline 294. During one decoding iteration input words 202, 204, and 206 are received by the parallel sets of decoder circuits 290, 292, and 294 respectively, processed by the stages of each pipeline, and decoded symbols 282, 284, and 286, and/or second leftover bit counts including 276B are output by system output selectors 232, 234, and 236.

Each of the sets of decoder circuits 212, 214, and 216 are similar or substantially the same as a set of decoder circuits 110. For a new input time cycle, each decoder circuit of sets of decoder circuits 212, 214, and 216 are configured to receive a fixed length word that may be referred to as a current word, and at least a portion of a fixed length word that may be referred to as a prior fixed length word. The prior fixed length word may precede the current fixed length word in the series of fixed length words 106 generated from the variable length code words 104. The prior fixed length word may serve as a current fixed length word in a prior parallel pipeline during the same decoding iteration. For example, in pipeline 292, input 204 has input[2] as a current fixed length word and input[1] as a prior fixed length word. Whereas pipeline 290 uses input[1] as a current fixed length word and input[0] as a prior fixed length word, and so forth. The prior fixed length words may comprise undecoded bits that are leftover when the word is processed as a current word in a parallel pipeline. For example, for a prior fixed length word=1100, where the last bit 0 is a leftover bit, and the current fixed length word=1111, then a decoder circuit would combine the leftover bit with the current word to form 01111, which decodes as 011=B and the two leftover bits=11.

As mentioned above, the leftover bits of a prior fixed length word may be combined with the bits of a current fixed length word for decoding by a respective decoder circuit. For example, during a new input time cycle, each decoder circuit of the set of decoder circuits 212 may receive input words 202, each decoder circuit of the set of decoder circuits 214 may receive input 204, and each decoder circuit of the set of decoder circuits 216 may receive input 206. Each of the input words 202, 204, and 206 may include two fixed length words 106 including a current fixed length word and a prior fixed length word (or at least a portion of the prior fixed length word). The prior fixed length word of input 204 may comprise all or a portion of the current fixed length word of input words 202. Similarly, the prior fixed input word of input 206 may comprise the current fixed length word of input 204. The prior input word of input words 202 may comprise a fixed length word that was a current fixed length word in pipeline 294 during a prior decoding iteration. For an initial decoding iteration, input words 202 may comprise a single fixed length word as a current word without a prior fixed length word or any preceding leftover bits. For subsequent decoding iterations, decoder circuits 212 may receive the fixed length code that was current during the prior decoding iteration in pipeline 294.

Each decoder circuit of each set of decoder circuits 212, 214, and 216 (e.g., decoder circuits 214A, 214B, 214C, and 214D of set of decoder circuits 214), is configured to receive a respective input word 202, 204, or 206, and decode the current fixed length word with a specified number of possible leftover bits of the prior fixed length word, and generate a respective output that may comprise a decoded symbol and/or a new count of undecoded bits that are left over after decoding. During a processing cycle when the sets of decoder circuits 212, 214, and 216 decode their respective inputs comprising a current fixed length word combined with leftover bits of a prior fixed length word, the sets of decoder circuits 212, 214, and 216 may not know how many bits will be leftover when the prior fixed length word is decoded in a parallel pipeline as a current fixed length word. Therefore, each set of decoder circuits 212, 214, and 216 is configured to decode its respective current fixed length word based on all possible leftover bit-counts. In this regard, each decoder circuit in the same set of decoder circuits may decode the same current fixed length word combined with a different number of possible leftover bits of the prior fixed length word. Each set of decoder circuits 212, 214, and 216 is configured to output a respective set of outputs where each output of each set may comprise a candidate undecoded symbol and/or a candidate new count of bits that are left over after decoding the current fixed length word combined with respective leftover bits. When a decoder circuit receives an input having bits that do not include a full encoded symbol, the input bits may remain undecoded and become leftover bits. The decoder circuit may output a new leftover bit count and a decoding result that does not include a decoded symbol. The new leftover bit-count may be based on all of the undecoded bits of prior input words for processing in the next pipeline. Eventually a pipeline will receive an input word combined with the undecoded leftover bits that includes all the bits of an encoded symbol, and a decoding result including a symbol will be output from a decoder. As such, each of the sets of decoder circuits 212, 214, and 216 is configured to output a respective set of decoder circuit outputs 242, 244, or 246 (i.e., a respective set of candidate outputs) for its respective input word 202, 204, or 206. The remaining stages of each pipeline determine which of the candidate outputs is valid.

For example, as shown in FIG. 3, input 204 is processed by pipeline 292. Input 204 includes input[1] that comprises a prior fixed length word, and input[2] that comprises a current fixed length word. The set of decoder circuits 214 comprises decoder circuits 214A-214D where each of the decoder circuits receives input 204. Decoder circuit 214A is associated with a fixed leftover bit-count of 0, decoder circuit 214B is associated with a fixed leftover bit-count of 1, decoder circuits 214C is associated with fixed leftover bit-count of 2, and decoder circuit 214D is associated with a fixed leftover bit-count of 3. Every time a new input 204 is received by the set of decoder circuits 214, each of the individual decoder circuits uses its respective fixed leftover bit-count in the decoding process. For example, decoder circuit 214A is configured to decode input 204 by combining 0 leftover bits of prior fixed length word input[1] with current fixed length word input[2] and generate a candidate decoded symbol(s) and/or a candidate new leftover bit-count. Decoder circuit 214B is configured to decode input 204 by combining 1 leftover bit of prior input[1] with current input[2] and generating a candidate decoded symbol(s) and/or a candidate (or new) leftover bit-count.

Decoder circuit 214C is configured to decode input 204 by combining 2 leftover bits of prior input[1] with current input[2] and generate a candidate decoded symbol(s) and/or a candidate (or new) leftover bit-count, and decoder circuit 214D is configured to decode input 204 by combining 3 leftover bits of prior input[1] with current input[2] and generate a candidate decoded symbol and/or a candidate (or new) leftover bit-count. The set of outputs 244 include all of the candidate decoded symbol(s) and candidate leftover bit-counts generated by the set of decoder circuits 214.

In some embodiments, the parallel sets of decoder circuits 212, 214, and 216 comprise suitable logic, circuitry, interfaces, code and/or data that are configured to perform table look-ups for decoding the respective input words 202, 204, and 206 and generating respective sets of decoder circuit outputs 242, 244, and 246, where respective outputs in the sets of decoder circuit outputs are candidates for selection in a later stage processing. In some embodiments, parallel sets of decoder circuits 212, 214, and 216 comprise suitable logic, circuitry, interfaces, code and/or data configured to decode the respective input words 202, 204, and 206 and generate respective sets of outputs 242, 244, and 246.

Leftover bit-count propagators 224 and 226 are similar or substantially the same as leftover bit-count propagators 120. Each of the parallel leftover bit-count propagators 224 and 226 may be coupled to a respective set of decoder circuits 214 and 216 of the same pipeline, and receive a respective set of the outputs 244 and 246 from their respective set of decoder circuits. Leftover bit-count propagators 224 and 226 may be implemented in a multiplexor and/or in a propagation table. In general, leftover bit-count propagators may also be configured to receive a subset of the new (i.e., candidate) leftover bit-counts from a leftover bit-count propagator in a prior parallel pipeline, and/or transmit a subset of the new (i.e., candidate) leftover bit-counts selected from their candidate leftover bit-counts to a leftover bit-count propagator of a following parallel pipeline. Since pipeline 290 does not include a leftover bit-count propagator, leftover bit-count propagator 224 may receive set of first leftover bit-counts 252 from set of decoder circuits 212, and may transmit its own selection comprising first leftover bit-counts 254 to leftover bit-count propagator 226. Any of the leftover bit-counts that are generated by the sets of decoder circuits 212, 214, and 216 after decoding a respective input may be referred to as a first leftover bit-count or a new leftover bit count. After a new leftover bit-count (or first leftover bit-count) is selected by and/or output by a system output selector 232, 234, or 236, it may be referred to as a second leftover bit-count. For example, a first leftover bit-count may be selected by system output selector 236 as a second leftover bit-count 276B. As described below, second leftover bit-count 276B may be fed-back to the inputs of system output selectors 232, 234, and 236 to be used in the next iteration of selection of an output from a set of selected outputs by the system output selectors 232, 234, and 236.

Each of the parallel leftover bit-count propagators 224 and 226 may comprise suitable logic, circuitry, interfaces, code and/or data that are configured to select a subset of their respective received set of decoder circuit outputs 244 or 246 to generate their respective set of selected decoder circuit outputs 264 or 266. The set of selected decoder circuit outputs 264 may comprise set of first leftover bit-counts 254. Set of first leftover bit-counts 252 and set of first leftover bit counts 254 are transmitted to a respective following pipeline. For example, each of the parallel leftover bit-count propagators 224 and 226 may receive set of first leftover bit counts 252 or set of first leftover bit-counts 254, respectively, from a prior parallel pipeline and utilize the respective set of first leftover bits from the prior pipeline to select a subset of outputs from the set of decoder circuit outputs 244 and 246 respectively. For example, leftover bit-count propagator 226 may receive set of decoder circuit outputs 246 from the set of decoder circuits 216, which includes a decoding result for each of the possible number of fixed leftover bit-counts. Leftover bit-count propagator 226 may select a subset of the set of decoder circuit outputs 246, where each selected output is selected based on one of the first leftover bits counts 254 that were determined when decoder circuits 214 decoded input 204 for each possible fixed leftover bit-count. In other words, a set of selected leftover bit-counts are propagated from a prior pipeline to a following pipeline to select a subset of leftover bit-counts from the following pipeline's set decoder circuit outputs. In this manner, the time consuming step of decoding the fixed length code words using a look-up table, which may take several time cycles for each code word, can be done in parallel to produce multiple respective outputs that are candidates for selection, and a selection of one of the respective outputs may be pipelined over time-efficient pipeline stages. For example, instead of waiting the full number of cycles it takes to decode each variable length code word before beginning to decode the next variable length code word, a stream of variable length code words divided into fixed length words may be processed in parallel. The number of time cycles it takes to decode an input may be utilized one time to decode a plurality of inputs into a plurality of candidate outputs, and the candidate outputs may be pipelined in a rapid fashion to select the correct outputs, thereby improving throughput in decoding prefix codes.

System output selectors 232, 234, and 236 are similar or substantially the same as system output selectors 130. Each of the system output selectors 232, 234 and 236 are configured to generate a respective output that may comprise one or more decoded symbol(s) such as the one or more decoded symbol(s) 282, 284, or 286. System output selectors 232, 234, and 236 may comprise multiplexors that are configured to receive second leftover bit-count 276A that may be generated by system output selector 236 from a prior iteration of outputting decoded symbol(s) from parallel inputs. The system output selectors 232, 234, and 236 may also be configured to receive decoded symbols that were generated by decoder circuits 212, 214, and 216. For example, system output selector 232 may receive the set of decoder circuit outputs 242, system output selector 234 may receive selected set of outputs 264, and system output selector 236 may receive selected set of outputs 266. The system output selectors 232, 234, 236 may each utilize second leftover bit-count 276A to select one of the outputs from the set of decoder circuit outputs 242, the set of selected decoder circuit outputs 264, or the set of selected decoder outputs 266, respectively. Each of the selected outputs may include one or more decoded symbol(s) or may not include a decoded symbol if a respective input word did not include a full encoded symbol. The system output selectors 232, 234, and 236 may each output the respective one or more decoded symbol(s) as decoded symbol(s) 282, 284, or 286, respectively. In instances where none of the decoder circuits in a set of decoder circuits generates a decoding result with a symbol, the respective system output selector does not output a decoded symbol. The set of decoder circuit outputs 242, as input to system output selector 232, may be referred to as a set of selected decoder circuit outputs 242.

As described above, after a decoding stage, a set of selected first leftover bit-counts (e.g., first leftover bit-counts 252, or 254) may be propagated from one pipeline to a following pipeline to select a set of first leftover bit-counts in the following pipeline (e.g., first leftover bit-counts 254 are utilized to select the set of selected decoder circuit outputs 266 from set of decoder circuit outputs 246). In this manner, the time consuming step of decoding a code word using a look-up table to output one or more decoded symbols, which may take several time cycles for each input, can be done in parallel for multiple inputs, and the process of selecting a decoded output (e.g., comprising one or more decoded symbols) may be pipelined through time-efficient stages, thereby improving throughput of decoding prefix codes. For example, instead of waiting the full number of cycles it takes to decode each variable length code word (e.g., a prefix code) before beginning to decode the next variable length code word, a stream of variable length code words that are divided into fixed length words, may be processed in parallel. The expensive number of time cycles otherwise used to decode a code word may be utilized once to decode a plurality of code words, then, outputs from each pipeline may be generated very quickly. For example, after decoding the plurality of parallel inputs, each pipeline may output a final decoded result in rapid succession. Meanwhile, the decoder stage may be decoding another plurality of input fixed length words.

As described above, leftover bit propagation may be performed by table lookup circuitry and/or multiplexor circuitry. In some embodiments, decoder circuitry 212, 214, and 216 may each be configured to generate a mapping table for propagating leftover bit-counts that are generated in a respective pipeline to a following parallel pipeline, where the propagated bit-counts are used to select a subset of decoder circuit outputs in the following pipeline. The propagation table may map each case of possible leftover bit-counts (e.g., 0, 1, 2, 3) from decoding a prior code words (e.g., prior leftover bit-counts), to the new count of leftover bits remaining after decoding the fixed length code words in the respective pipeline, and the resulting decoded symbol(s). Table 3 (below) comprises a mapping of possible prior leftover bit-counts to new leftover bit-counts for propagating decoded symbol results and/or new leftover bit-counts through parallel pipelines for decoding fixed length words that comprise variable length code words. Each row of decoding results shown in Table 3 indicates a possible current decoded symbol and a new count of leftover bits that would result from decoding a current word combined with prior leftover bits, given the possible count of leftover bit indicated in the first column. For example, Table 3 indicates four possible results for decoding each of inputs {0100 1100} and {1100 1111} of the fixed width code words {0100 1100 1111}. The inputs are decoded for four possible counts of prior leftover bits (0, 1, 2, or 3). The result of decoding 0100 is not shown in Table 3. In the middle column, it is shown that 0100 is a prior word and the current word is 1100. If there were 0 leftover bits after decoding 0100, then the value 1100 is currently decoded, and result is the symbol E with one leftover bit (see Table 1 above for decoding symbols). If there was 1 leftover bit after decoding 0100, then the value 01100 is currently decoded, which results in the symbols BF with zero bits leftover. However, two leftover bits is not a valid case after decoding 0100, since 00 is decodable, and therefore 00 would not be leftover. Also, three leftover bits is not a valid case since 100 is decodable.

The last column of Table 3 is populated in the same manner as the middle column, using 1100 as the prior word and 1111 as the current word.

TABLE 3

Mapping Prior Leftover Bit-counts to New Leftover Bit-counts in a Propagation Table

| Input: Possible Prior Counts of Leftover Bits (i.e., fixed leftover bit count) | {0100 1100} (prior code word, current code word) Decoded Symbol(s), New Count of Leftover Bits (after decoding the input above) | {1100 1111} (prior code word, current code word) Decoded Symbol(s), New Count of Leftover Bits (after decoding the input above) |
|---|---|---|
| 0 | E, 1 (decoding 1100) | H, 0 (decoding 1111) |
| 1 | BF, 0 (decoding 01100) | B, 2 (decoding 0 1111) |
| 2 | N/A (001100 - not valid prior leftover bits) | N/A (001111 - not valid prior leftover bits) |
| 3 | NA (1001100 - not valid prior leftover bits) | NA (1001111 - not valid prior leftover bits) |

The results entered in Table 3 indicate a possible current decoded symbol and new count of leftover bits after decoding a current input value combined with prior leftover bits, for each of the four possible counts of prior leftover bits (e.g., 0, 1, 2, or 3). By tracing leftover bit-counts through Table 3, the leftover bit-count for a current word can be determined based on a known prior leftover bit-count. For example, for current word 1100, the current leftover bit-count may be determined by decoding the prior input word 0100, which results in the symbol A with 1 bit leftover (see Table 1 above). In this regard, the first three bits of the prior input word 010 decode to the symbol A, and the last bit, 0, is leftover. Since there was one prior bit leftover after decoding 0100, the last bit 0 can be combined with the current word 1100, to form 01100. In the column under input 0100 1100, the row corresponding to a count of 1 prior leftover bit indicates that the result of decoding 01100, is the symbols BF with 0 bits leftover. In other words, one of four possible results of decoding a current word combined with leftover bits of a prior word may be selected from Table 3 using a known prior leftover bit-count. Similarly, referring to the last column of Table 3, knowing that the leftover bit-count is 0 after decoding 1100 of the middle column, allows for the selection of the decoded symbol and next leftover bit-count for the current word 1111 combined with prior leftover bits if there are any. Since the prior leftover bit-count was 0 after decoding 1100, the output in the third column in the row corresponding to 0 prior leftover bits, yields the decoded symbol H and a current leftover bit-count of 0, after decoding the current word 1111.

In this manner, the decoder circuit table read is not dependent on the prior leftover bit-count and is removed from the dependence path. This allows the decoding process to be pipelined. Furthermore, propagating the output from the decoder table (or multiplexor) allows for parallelizing across inputs. In other words, the present disclosure improves prefix code decoding by decreasing the dependence path and allowing parallelization across inputs for table-based decoder circuits. This allows the decoder circuits to achieve a higher throughput through better performance per input (e.g., a lower iteration interval and fewer or faster clock cycles) and decoding multiple code word inputs per iteration.

Embodiments for decoding variable length code words in a pipelined parallel processing system may be implemented in various ways. For example, FIG. 4 is a block diagram showing leftover bit-count table propagations for a pipelined parallel system 400 for decoding variable length code words, according to an example embodiment.

Figure 4:
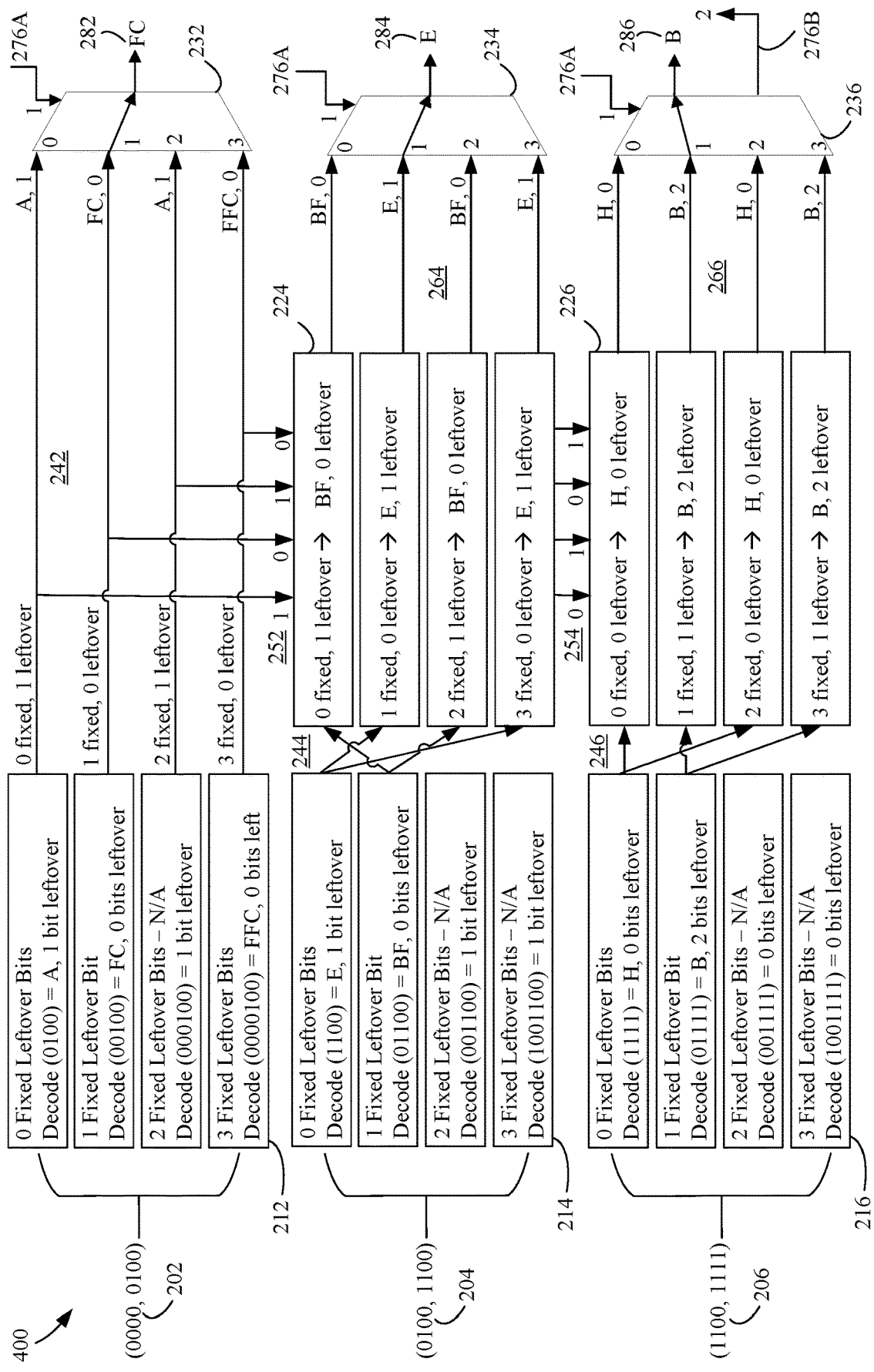
FIG. 4 is a block diagram showing leftover bit-count table propagations for a pipelined parallel system for decoding variable length code words, according to an example embodiment.

As shown in FIG. 4, system 400 includes sets of decoder circuits 212, 214, and 216, leftover bit-count propagators 224 and 226, and system output selectors 232, 234, and 236. Also shown in FIG. 4 are input words 202, 204, and 206, sets of decoder circuit outputs 242, 244, and 246, selected sets of first leftover bit-counts 252 and 254, selected sets of outputs 264 and 266, second leftover bit-count 276A, second leftover bit-count 276B, decoded symbol(s) 282, 284, and 286. Computing device 102 may comprise system 400. System 400 is described in further detail as follows.

As shown in FIG. 4, input words 202, 204, and 206 are entered in parallel into the sets of decoder circuits 212, 214, and 216, respectively. Sets of decoder circuits 212, 214, and 216 comprise a first stage of pipelines 292, 294, and 296 described with respect to FIGS. 2 and 3. As described above, input words 202, 204, and 206 comprise fixed length words that are generated from a stream of variable length code words (e.g., prefix codes).

Referring to FIG. 4, input words 202 comprises prior fixed length word 0000 and current fixed length word 0100. Input 204 comprises prior fixed length word 0100 and current fixed length word 1100. Input 206 comprises prior fixed length word 1100 and current fixed length word 1111. Each of the sets of decoder circuits 212, 214, and 216 is configured to decode its respective current fixed length word combined with the various possible leftover bits from decoding its respective prior fixed length word. Each decoder circuit of each of the sets of decoder circuits 212, 214, and 216 is assigned a fixed count of leftover bits from the possible numbers of leftover bits 0, 1, 2, or 3, and combines its assigned fixed count of leftover bits from its prior fixed length word with its current fixed length word for decoding. For example, set of decoder circuits 212 is configured to decode its respective current fixed length word 0100 with 0, 1, 2, and 3 possible leftover bits as words 0100, 00100, 000100, and 0000100. Similarly, set of decoder circuits 214 is configured to decode its respective current word 1100 combined with the possible leftover bits of its respective prior fixed length word 0100 as words 1100, 01100, 001100, and 1001100, and so on for set of decoder circuits 216. As a result of the decoding process, sets of decoder circuits 212, 214, and 216 each output a respective set of decoder circuit outputs 242, 244, and 246, which may include a decoded symbol(s) and a new leftover bit-count representing the number of bits leftover after the decoding process. Therefore, the set of decoder circuit outputs 242 comprises decoded symbol(s) and set of first leftover bit-counts 252, and set of decoder circuit outputs 244 includes decoded symbol(s) and a set of first leftover bit-counts 254. As described above, some of the possible fixed leftover bit-counts are not valid or not applicable (e.g., N/A). For instance, where the possible leftover bits comprise one or more variable length code words (i.e., a prefix code) they would not be leftover, and instead would have been fully decoded in a prior pipeline or prior iteration of decoding as an output symbol.

Leftover bit-count propagator 224 may comprise a mapping table for mapping the set of first leftover bit-counts 252 to outputs of the set of decoder circuit outputs 244 in order to select the set of selected decoder circuit outputs 264 (i.e., a subset of the set of decoder circuit outputs 244). For example, the first leftover bit-count (1) of the set of first leftover bit-counts 252 maps to the decoder circuit 214B of the set of decoder circuits 214 having an assigned fixed leftover bit-count of (1). Thus, leftover bit-count propagator 224 selects the output of that decoder circuit 214B (e.g., BF, 0 bits leftover) to be included in the set of selected decoder circuit outputs 264. The next leftover bit-count (0) of the set of first leftover bit-counts 252 maps to the decoder circuit 214A of the set of decoder circuits 214 having an assigned fixed leftover bit-count of (0). Thus, leftover bit-count propagator 224 selects the output of that decoder circuit 214A (e.g., E, 1 bit leftover) to be included in the set of selected decoder circuit outputs 264, and so on for each leftover bit-count in the set of first leftover bit-counts 252.

Similarly, leftover bit-count propagator 226 may comprise a mapping table for mapping the set of first leftover bit-counts 254 to outputs of the set of decoder circuit outputs 246, in order to select the set of selected decoder circuit outputs 266 (i.e., a subset of the set of decoder circuit outputs 246). For example, the first leftover bit-count (0) of the set of first leftover bit-counts 254 maps to the decoder circuit of the set of decoder circuits 216 having the assigned leftover bit-count of (0). Thus, leftover bit-count propagator 226 selects the output of that decoder circuit (H, 0 bits leftover) to be included in the set of selected decoder circuit outputs 266. The next leftover bit-count (1) of the set of first leftover bit-counts 254 maps to the decoder circuit of the set of decoder circuits 216 having a fixed leftover bit-count of (1). Thus, leftover bit-count propagator 226 selects the output of that decoder circuit (B, 2 bits leftover) to be included in the set of selected decoder circuit outputs 266, and so on for each leftover bit-count in the set of first leftover bit-counts 254. The leftover bit-count propagator 224 is configured to output set of selected decoder circuit outputs 264, and leftover bit-count propagator 226 is configured to output the set of selected decoder circuit outputs 266.

In other words, system 400 may decode the fixed length words {0100 1100 1111}, with one bit leftover from decoding the last fixed length code word (0000) of a prior iteration of decoding. The leftover bit (0) processed by the set of decoder circuits 212 that decodes input words 202, produces zero bits leftover, and the zero leftover bits into the set of decoder circuits 214 receiving input 204 results in an output comprising (E, 1 leftover bit). The leftover bit-count 0 from set of decoder circuits 212 into leftover bit-count propagator 224 results in selection of the output of set of decoder circuits 214 comprising (E, 1 leftover bit). The leftover bit count of 1 into the set of decoder circuits 216 receiving input 206 results in an output of (B, 2 leftover bits). The leftover bit count of 1 from leftover bit-count propagator 224 received in leftover bit-count propagator 226 results in selection from the output of decoder circuits 216 comprising (B, 2 leftover bits) as part of the set of selected decoder circuit outputs 266.

System output selector 232 is configured to receive the set of decoder circuit outputs 242 from the set of decoder circuits 212. System output selector 234 is configured to receive set of selected decoder circuit outputs 264 from leftover bit-count propagator 224. System output selector 236 is configured to receive set of selected decoder circuit outputs 266 from leftover bit-count propagator 226. Each of the system output selectors 232, 234, and 236 are configured to receive the second leftover bit-count 276A comprising a leftover bit count of 1, which is a count of leftover bits from the prior iteration of parallel decoding in system 400 of fixed length word 0000. Thus system output selector 232 selects the output of set of decoder circuit outputs 242 associated with second leftover bit-count 276A of (1), which corresponds to decoded symbols 282 (FC). System output selector 234 selects the output set of selected decoder circuit outputs 264 associated with the second leftover bit-count 276A of (1), which corresponds to decoded symbol 284 (E). System output selector 236 also selects the output of set of selected decoder circuit outputs 266 associated with the leftover bit-count 276A of (1), which corresponds to decoded symbol B 286. In this manner, the fixed length words {0100 1100 1111}, which correspond to variable length prefix code words {00, 100, 110, 011} with 2 bits (11) leftover, are decoded based on one leftover bit (0) from a prior iteration of decoding 0000, as F, C, E, B, with a count of 2 bits leftover as the second leftover bit-count 276B (see Table 1 above for decoding). The second leftover bit-count 276B, comprising the value of 2, is fed-back to each of the system output selectors 232, 234, and 236 for the next iteration of decoding parallel inputs to pipelines 290, 292, and 294. Thus, as described above, the throughput for decoding variable length code words (e.g., prefix codes) is improved.

Figure 5:
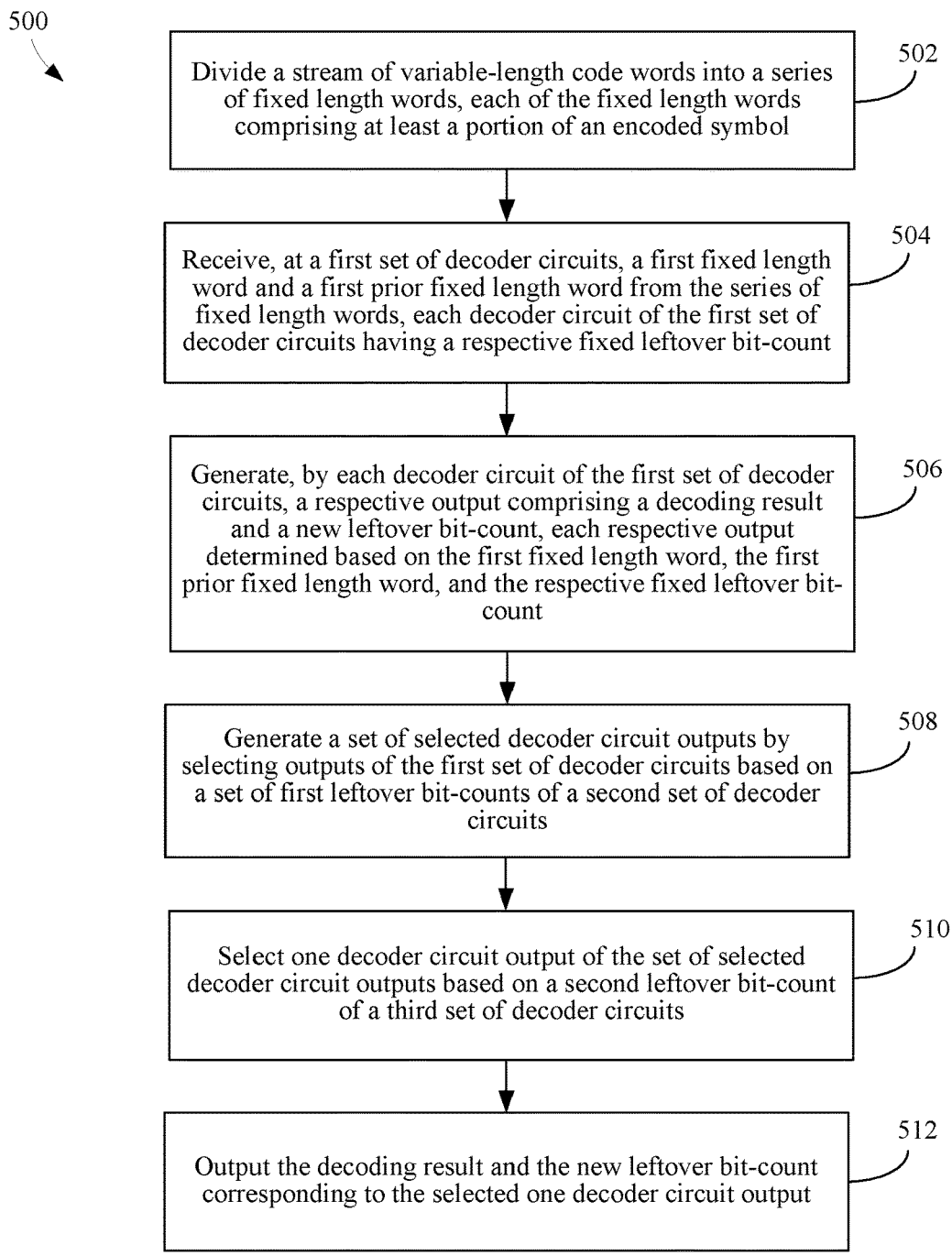
FIG. 5 is a flowchart of a method for decoding variable-length codes in a pipelined parallel process, according to an example embodiment.

Embodiments for decoding variable length code words in a pipelined parallel processing system may be implemented in various ways. For example, FIG. 5 is a flowchart 500 of a method for decoding variable-length codes in a pipelined parallel process, according to an example embodiment. Flowchart 500 may be performed by computing device 102. For the purpose of illustration, flowchart 500 of FIG. 5 is described as follows with reference to FIGS. 1-5.

Flowchart 500 of FIG. 5 begins with step 502. In step 502, a stream of variable-length code words 104 is divided into a series of fixed length words 106, where each of the fixed length words comprises at least a portion of an encoded symbol. For example, bit stream preprocessor 108 receives variable length code words 104 and divides the variable length code words into a series of fixed length words (i.e., chunks), such as fixed length words 106, where each fixed length word 106 may have the same number of bits.

In step 504, a first set of decoder circuits receives a first fixed length word and a first prior fixed length word from the series of fixed length words, where each decoder circuit of the first set of decoder circuits has a respective fixed leftover bit-count. For example, set of decoder circuits 214 receives input 204 comprising a first fixed length word 106 and a first prior fixed length word 106 from a series of fixed length words. Each decoder circuit 214A, 214B, 214C, and 214D of the set of decoder circuits 214 has a respective fixed leftover bit-count. For example, each of the decoder circuits in each set of decoder circuits 212, 214, and 216 is assigned a predetermined count of leftover bit-counts that is fixed for each iteration of decoding fixed length word inputs. The assigned counts of leftover bit-counts may be determined based on the number of bits in the fixed length words that are being decoded. For example, for 4 bit fixed length words or chunks 106, there may be 0, 1, 2, or 3 bits leftover after decoding a fixed length word 106.

In step 506, each decoder circuit of the first set of decoder circuits generates a respective output comprising a decoding result and a new leftover bit-count, where each respective output is determined based on the first fixed length word, the first prior fixed length word, and the respective fixed leftover bit-count. For example, each decoder circuit 214A, 214B, 214C, and 214D of the set of decoder circuits 214 receives input 204 that comprises a fixed length word and a prior fixed length word, and decodes the fixed length word combined bits from the prior fixed length word based on the respective fixed leftover bit-count assigned to the particular decoder circuit of the set of decoder circuits 214. The decoder circuit generates a respective output of the set of decoder circuit outputs 244 that may include at least one decoded symbol 284 and a new leftover bit-count, as a result of the decoding of the fixed length word combined with the assigned number leftover bits from the prior fixed length (e.g., from input 204). In some embodiments, a decoder circuit may receive and process input bits that do not include all the bits of a symbol. Thus, the decoding result is empty (e.g., does not specify any symbol) and the input bits all become new leftover bits and are included in the new leftover bit count.

In step 508, a set of selected decoder circuit outputs is generated by selecting outputs of the first set of decoder circuits based on a set of first leftover bit-counts of a second set of decoder circuits. For example, leftover bit-count propagator 224 generates a set of selected decoder circuit outputs 264 by selecting a subset of the set of decoder circuit outputs 244 based on the set of first leftover bit-counts 252 from the set of decoder circuits 212.

In step 510, one decoder circuit output of the set of selected decoder circuit outputs is selected based on a second leftover bit-count of a third set of decoder circuits. For example, system output selector 234 may select one of the decoder circuit outputs 264 based on a leftover bit-count of 276A of the set of decoder circuits 216. The leftover bit-count 276A may be generated during a prior iteration of decoding for a prior set of parallel fixed length word inputs to the pipelines 290, 291, and 292. Moreover, the third set of decoder circuits may comprise the first set of decoder circuits, for example, when the first set of decoder circuits is the set of decoder circuits 216 and the second leftover bit-count is the leftover bit-count 276A that is generated by the set of decoder circuits 216 during a prior iteration of decoding.

In step 512, the decoding result and the new leftover bit-count corresponding to the selected one decoder circuit output may be output. For example, system output selector 234 may output a decoded symbol 284 of the selected one output of the decoder circuit outputs 264. System output selector 234 may also output a new leftover bit-count of the selected one output that was determined when the selected one of the decoder circuit outputs 264 was decoded in the set of decoder circuits 214.

Figure 6:
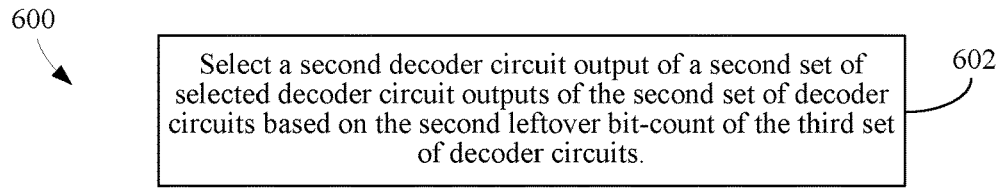
FIG. 6 is a flowchart of a method for decoding variable-length codes in a pipelined parallel process, according to an example embodiment.

Embodiments for decoding variable length code words in a pipelined parallel processing system may be implemented in various ways. For example, FIG. 6 is a flowchart 600 of a method for decoding variable-length codes in a pipelined parallel process, according to an example embodiment. Flowchart 600 may be performed by computing device 102. For the purpose of illustration, flowchart 600 of FIG. 6 is described as follows with reference to FIGS. 1-4 and 6.

Flowchart 600 of FIG. 6 includes step 602. In step 602, a second decoder circuit output of a second set of selected decoder circuit outputs of the second set of decoder circuits is selected based on the second leftover bit-count of the third set of decoder circuits. For example, a decoder circuit output of the set of selected decoder circuit outputs 242 of the set of decoder circuits 212, is selected based on the second leftover bit-count 276A of the set of decoder circuits 216. The set of decoder circuit outputs 242 may be referred to as the selected set of decoder circuit outputs 242.

Figure 7:
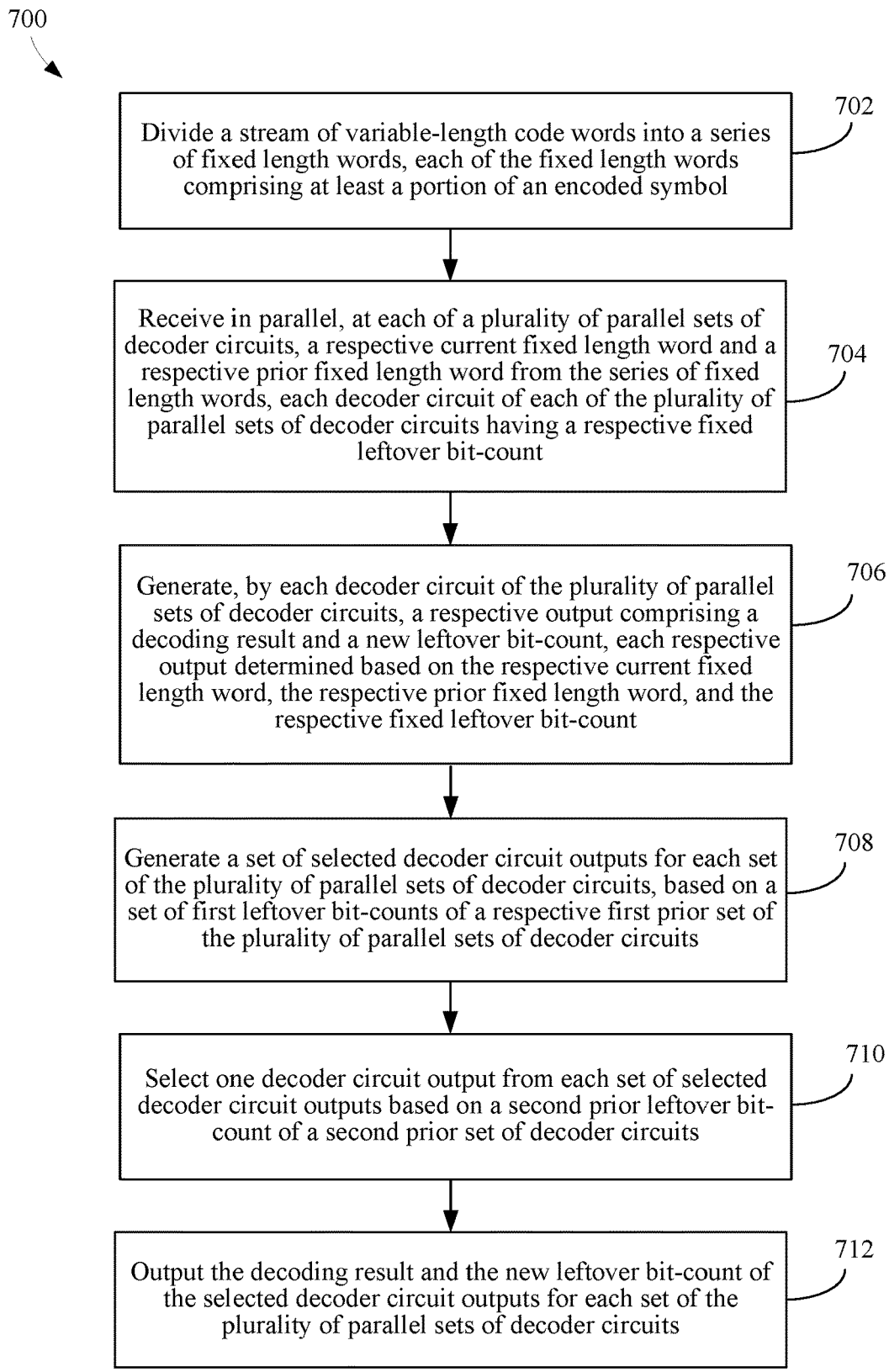
FIG. 7 is a flowchart of a method for decoding variable-length codes in a parallel process, according to an example embodiment.

Embodiments for decoding variable length code words in a pipelined parallel processing system may be implemented in various ways. For example, FIG. 7 is a flowchart 700 of a method for decoding variable-length codes in a parallel process, according to an example embodiment. Flowchart 700 may be performed by computing device 102. For the purpose of illustration, flowchart 700 of FIG. 7 is described as follows with reference to FIGS. 1-4 and 7.

Flowchart 700 of FIG. 7 begins with step 702. In step 702, a stream of variable-length code words is divided into a series of fixed length words, where each of the fixed length words comprises at least a portion of an encoded symbol. For example, bit stream preprocessor 108 receives variable length code words 104 and divides the variable length code words into a series of fixed length words (i.e., chunks), such as fixed length words 106, where each fixed length word 106 may have the same number of bits.

In step 704, at each of a plurality of parallel sets of decoder circuits, a respective current fixed length word and a respective prior fixed length word from the series of fixed length words is received in parallel, where each decoder circuit of each of the plurality of parallel sets of decoder circuits has a respective fixed leftover bit-count. For example, at each of the plurality of sets of decoder circuits 212, 214, and 216, a respective current fixed length word and a respective prior fixed length word (e.g., in input words 202, 204, and 206 respectively) from a series of fixed length words 106 is received in parallel. Each decoder circuit of each of the plurality of parallel sets of decoder circuits 212, 214, and 216, has a respective fixed (i.e., assigned) leftover bit-count (e.g., 0, 1, 2, or 3).

In step 706, each decoder circuit of the plurality of parallel sets of decoder circuits may generate a respective output comprising a decoding result and a new leftover bit-count, where each respective output is determined based on the respective current fixed length word, the respective prior fixed length word, and the respective fixed leftover bit-count. For example, each decoder circuit of the plurality of parallel sets of decoder circuits 212, 214, and 216 may generate a respective output comprising that may include at least one decoded symbol 282, 284, and 286, respectively, and a new leftover bit-count. Each respective output may be determined based on the respective current fixed length word, the respective prior fixed length word, and the respective fixed leftover bit-count. The set of decoder circuit outputs 242 may comprise the respective outputs of each of the decoder circuits of the set of decoder circuit 212. The set of decoder circuit outputs 244 may comprise the respective outputs of each of the decoder circuits (e.g., 214A, 214B, and 214C) of the set of decoder circuit 214. The set of decoder circuit outputs 246 may comprise the respective outputs of each of the decoder circuits of the set of decoder circuit 216. In some embodiments, a decoder circuit may receive and process input bits that do not include all the bits of a symbol. Thus, the decoding result is empty (e.g., does not specify a symbol) and the input bits all become new leftover bits and are included in the new leftover bit count In step 708, for each set of the plurality of parallel sets of decoder circuits, generate a set of selected decoder circuit outputs based on a set of first leftover bit-counts of a respective first prior set of the plurality of parallel sets of decoder circuits. For example, for each set of the plurality of parallel sets of decoder circuits 214 and 216, generate a set of selected decoder circuit outputs 264 and 266, respectively, based on a set of first leftover bit-counts 252 and 254 of a respective first prior set of the plurality of parallel sets of decoder circuits 212, and 214 respectively. The set of decoder circuit outputs 242 may also be referred to as a set of selected decoder circuit outputs.

In step 710, one decoder circuit output is selected from each set of selected decoder circuit outputs based on a second prior leftover bit-count. For example, system output selectors 232, 234, and 236 may select one decoder circuit output from each set of selected decoder circuit outputs 242, 264, or 266, respectively, based on a second prior leftover bit-count 276A.

In step 712, the decoding result and the new leftover bit-count of the selected decoder circuit outputs are output for each set of the plurality of parallel sets of decoder circuits. For example, in some embodiments, system output selectors 232, 234, and 236 may output the at least one decoded symbol 282, 284, or 286 and/or the corresponding new leftover bit-counts from the selected decoder circuit outputs 242, 264, or 266, respectively, for each set of the plurality of parallel sets of decoder circuits 212, 214, or 216, respectively.

III. Example Computer System Implementation

Each of computing device 102, bit stream preprocessor 108, decoder circuits 110, leftover bit-count propagators 120, and system output selectors 130, parallel pipelines 290, 292, 294, sets of decoder circuits 212, 214, and 216, leftover bit-count propagators 224 and 226, system output selectors 232, 234, and 236 described herein may be implemented in hardware, or hardware combined with software and/or firmware. For example, bit stream preprocessor 108, decoder circuits 110, leftover bit-count propagators 120, and system output selectors 130, pipelines 290, 292, 294, sets of decoder circuits 212, 214, and 216, leftover bit-count propagators 224 and 226, system output selectors 232, 234, and 236 may be implemented as computer program code/instructions configured to be executed in one or more processors and stored in a computer readable storage medium. Alternatively, bit stream preprocessor 108, decoder circuits 110, leftover bit-count propagators 120, and system output selectors 130, parallel pipelines 290, 292, 294, sets of decoder circuits 212, 214, and 216, leftover bit-count propagators 224 and 226, system output selectors 232, 234, and 236 may be implemented as hardware logic/electrical circuitry.

As noted herein, the embodiments described, including but not limited to, system 100 of FIG. 1, system 200 of FIGS. 2 and 3, and system 400 of FIG. 4 along with any components and/or subcomponents thereof, as well any operations and portions of flowcharts/flow diagrams described herein and/or further examples described herein, may be implemented in hardware, or hardware with any combination of software and/or firmware, including being implemented as computer program code configured to be executed in one or more processors and stored in a computer readable storage medium, or being implemented as hardware logic/electrical circuitry, such as being implemented together in a system-on-chip (SoC), a field programmable gate array (FPGA), an application specific integrated circuit (ASIC), a trusted platform module (TPM), a timing controller (TCON), and/or the like. A SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

Embodiments described herein may be implemented in one or more computing devices similar to a mobile system and/or a computing device in stationary or mobile computer embodiments, including one or more features of mobile systems and/or computing devices described herein, as well as alternative features. The descriptions of computing devices provided herein are provided for purposes of illustration, and are not intended to be limiting. Embodiments may be implemented in further types of computer systems, as would be known to persons skilled in the relevant art(s).

Figure 8:
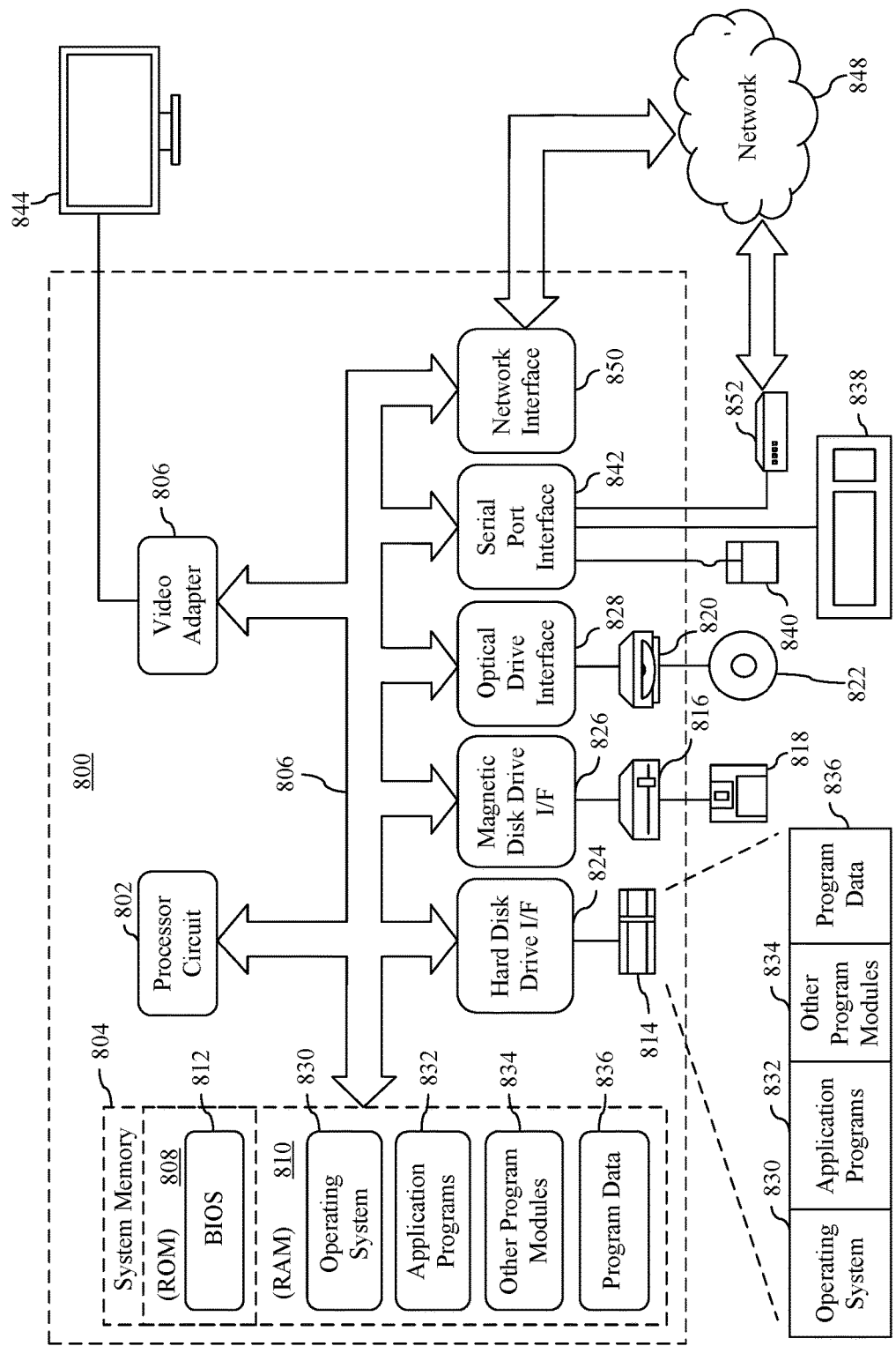
FIG. 8 is a block diagram of an example processor-based computer system that may be used to implement various embodiments.

FIG. 8 is a block diagram of an example processor-based computer system 800 that may be used to implement various embodiments. For example, in an embodiment, one or more, in any combination, of computing device 102, bit stream preprocessor 108, decoder circuits 110, leftover bit-count propagators 120, and system output selectors 130, parallel pipelines 290, 292, 294, sets of decoder circuits 212, 214, and 216, leftover bit-count propagators 224 and 226, system output selectors 232, 234, and 236 may include any type of computing device, mobile or stationary, such as a desktop computer, a server, a video game console, etc. For example, in an embodiment, one or more, in any combination of computing device 102, bit stream preprocessor 108, decoder circuits 110, leftover bit-count propagators 120, and system output selectors 130, parallel pipelines 290, 292, 294, sets of decoder circuits 212, 214, and 216, leftover bit-count propagators 224 and 226, system output selectors 232, 234, and 236 may be implemented in one or more computer devices similar to computing device 800 in any type of stationary or mobile computing device (e.g., a Microsoft® Surface® device, a personal digital assistant (PDA), a laptop computer, a notebook computer, a tablet computer such as an Apple iPad™, a netbook, etc.), a mobile phone (e.g., a cell phone, a smart phone such as a Microsoft Windows® phone, an Apple iPhone, a phone implementing the Google® Android™ operating system, etc.), a wearable computing device (e.g., a head-mounted device including smart glasses such as Google® Glass™, Oculus Rift® by Oculus VR, LLC, etc.), a stationary computing device such as a desktop computer or PC (personal computer), a gaming console/system (e.g., Microsoft Xbox®, Sony PlayStation®, Nintendo Wii® or Switch®, etc.), etc.

Computing device 102, bit stream preprocessor 108, decoder circuits 110, leftover bit-count propagators 120, and system output selectors 130, parallel pipelines 290, 292, 294, sets of decoder circuits 212, 214, and 216, leftover bit-count propagators 224 and 226, system output selectors 232, 234, and 236 may be implemented in one or more computing devices containing features similar to those of computing device 800 in stationary or mobile computer embodiments and/or alternative features. The description of computing device 800 provided herein is provided for purposes of illustration, and is not intended to be limiting. Embodiments may be implemented in further types of computer systems, as would be known to persons skilled in the relevant art(s).

As shown in FIG. 8, computing device 800 includes one or more processors, referred to as processor circuit 802, a system memory 804, and a bus 806 that couples various system components including system memory 804 to processor circuit 802. Processor circuit 802 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. Processor circuit 802 may execute program code stored in a computer readable medium, such as program code of operating system 830, application programs 832, other programs 834, etc. Bus 806 represents one or more of any of several types of bus structures, including a memory bus or memory controller, a peripheral bus, an accelerated graphics port, and a processor or local bus using any of a variety of bus architectures. System memory 804 includes read only memory (ROM) 808 and random-access memory (RAM) 810. A basic input/output system 812 (BIOS) is stored in ROM 808.

Computing device 800 also has one or more of the following drives: a hard disk drive 814 for reading from and writing to a hard disk, a magnetic disk drive 816 for reading from or writing to a removable magnetic disk 818, and an optical disk drive 820 for reading from or writing to a removable optical disk 822 such as a CD ROM, DVD ROM, or other optical media. Hard disk drive 814, magnetic disk drive 816, and optical disk drive 820 are connected to bus 806 by a hard disk drive interface 824, a magnetic disk drive interface 826, and an optical drive interface 828, respectively. The drives and their associated computer-readable media provide nonvolatile storage of computer-readable instructions, data structures, program modules and other data for the computer. Although a hard disk, a removable magnetic disk and a removable optical disk are described, other types of hardware-based computer-readable storage media can be used to store data, such as flash memory cards, digital video disks, RAMs, ROMs, and other hardware storage media.

A number of program modules may be stored on the hard disk, magnetic disk, optical disk, ROM, or RAM. These programs include operating system 830, one or more application programs 832, other programs 834, and program data 836. Application programs 832 or other programs 834 may include, for example, computer program logic (e.g., computer program code or instructions) for implementing computing device 102, bit stream preprocessor 108, decoder circuits 110, leftover bit-count propagators 120, and system output selectors 130, parallel pipelines 290, 292, 294, sets of decoder circuits 212, 214, and 216, leftover bit count propagators 224 and 226, system output selectors 232, 234, and 236, flowchart 500, flowchart 600, flowchart 700, and/or further embodiments described herein. Program data 836 may include variable length code words 104 (e.g., prefix codes, Huffman codes, etc.), fixed length words 106, candidate decoder circuit outputs, first leftover bit-counts, selected candidate decoder circuit outputs, second leftover bit-counts, selected decoded symbols, selected second leftover bit-counts, fixed length words of input words 202, 204, and 206, sets of outputs 242, 244, and 246, sets of first leftover bit-counts (e.g., new leftover bit-counts) 252 and 254, selected sets of outputs 264 and 268, second leftover bit-count 276A, decoded symbols 282, 284, and 286, second leftover bit-count 267B, and/or further embodiments described herein.

A user may enter commands and information into computing device 800 through input devices such as keyboard 838 and pointing device 840. Other input devices (not shown) may include a microphone, joystick, game pad, satellite dish, scanner, a touch screen and/or touch pad, a voice recognition system to receive voice input, a gesture recognition system to receive gesture input, or the like. These and other input devices are often connected to processor circuit 802 through a serial port interface 842 that is coupled to bus 806, but may be connected by other interfaces, such as a parallel port, game port, or a universal serial bus (USB).

A display screen 844 is also connected to bus 806 via an interface, such as a video adapter 846. Display screen 844 may be external to, or incorporated in computing device 800. Display screen 844 may display information, as well as being a user interface for receiving user commands and/or other information (e.g., by touch, finger gestures, virtual keyboard, etc.). In addition to display screen 844, computing device 800 may include other peripheral output devices (not shown) such as speakers and printers.

Computing device 800 is connected to a network 848 (e.g., the Internet) through an adaptor or network interface 850, a modem 852, or other means for establishing communications over the network. Modem 852, which may be internal or external, may be connected to bus 806 via serial port interface 842, as shown in FIG. 8, or may be connected to bus 806 using another interface type, including a parallel interface.

As used herein, the terms "computer program medium," "computer-readable medium," and "computer-readable storage medium" are used to refer to physical hardware media such as the hard disk associated with hard disk drive 814, removable magnetic disk 818, removable optical disk 822, other physical hardware media such as RAMs, ROMs, flash memory cards, digital video disks, zip disks, MEMs, nanotechnology-based storage devices, and further types of physical/tangible hardware storage media. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media that are separate and non-overlapping with embodiments directed to computer-readable storage media.

As noted above, computer programs and modules (including application programs 832 and other programs 834) may be stored on the hard disk, magnetic disk, optical disk, ROM, RAM, or other hardware storage medium. Such computer programs may also be received via network interface 850, serial port interface 842, or any other interface type. Such computer programs, when executed or loaded by an application, enable computing device 800 to implement features of embodiments discussed herein. Accordingly, such computer programs represent controllers of computing device 800.

Embodiments are also directed to computer program products comprising computer code or instructions stored on any computer-readable medium. Such computer program products include hard disk drives, optical disk drives, memory device packages, portable memory sticks, memory cards, and other types of physical storage hardware.

IV. Additional Examples and Advantages

In an embodiment, a method is provided for decoding variable-length codes in a parallel process. The method comprises dividing a stream of variable-length code words into a series of fixed length words. Each of the fixed length words comprises at least a portion of an encoded symbol. At a first set of decoder circuits, a first fixed length word and a first prior fixed length word from the series of fixed length words are received. Each decoder circuit of the first set of decoder circuits has a respective fixed leftover bit-count. Each decoder circuit of the first set of decoder circuits generates a respective output comprising at least one decoded symbol and a new leftover bit-count. Each respective output is determined based on the first fixed length word, the first prior fixed length word, and the respective fixed leftover bit-count. A set of selected decoder circuit outputs is generated by selecting outputs of the first set of decoder circuits, based on a set of first leftover bit-counts of a second set of decoder circuits. One decoder circuit output of the set of selected decoder circuit outputs is selected based on a second leftover bit-count of a third set of decoder circuits. The at least one decoded symbol and the new leftover bit-count corresponding to the selected one decoder circuit output.

In an embodiment of the foregoing method, a second decoder circuit output of a second set of selected decoder circuit outputs of the second set of decoder circuits is selected based on the second leftover bit-count of the third set of decoder circuits.

In an embodiment of the foregoing method, the first set of decoder circuits and the second set of decoder circuits are parallel sets of decoder circuits, and each decoder circuit of the second set of decoder circuits has a same respective fixed leftover bit-count as a corresponding decoder circuit of the first set of decoder circuits.

In an embodiment of the foregoing method, each first leftover bit-count of the second set of decoder circuits comprises a count of bits leftover after a corresponding decoder circuit of the second set of decoder circuits decodes the first prior fixed length word and a second prior fixed length word based on its respective fixed leftover bit-count.

In an embodiment of the foregoing method, each decoder circuit of the third set of decoder circuits has the same respective fixed leftover bit-count as a corresponding decoder circuit of the first set of decoder circuits.

In an embodiment of the foregoing method, the second leftover bit-count comprises a count of bits leftover after each decoder circuit of the third set of decoder circuits decodes a second prior fixed length word and a third prior fixed length word of the series of fixed length words.

In an embodiment of the foregoing method, the second leftover bit-count is selected from decoder circuit outputs of the third set of decoder circuits.

In an embodiment of the foregoing method, the variable length code is a prefix code.

In an embodiment, a system for decoding variable-length codes in a parallel process comprises one or more processors and one or more memory devices that store program code to be executed by the one or more processors. The program code comprises a bit stream preprocessor configured to divide a stream of variable-length code words into a series of fixed length words, where each of the fixed length words comprises at least a portion of an encoded symbol. The system also comprises a first set of decoder circuits, where each decoder circuit of the first set of decoder circuits has a respective fixed leftover bit-count. Each decoder circuit configured to receive a first fixed length word and a first prior fixed length word from the series of fixed length words, and generate a respective output comprising at least one decoded symbol and a new leftover bit-count. Each respective output is determined based on the first fixed length word, the first prior fixed length word, and the respective fixed leftover bit-count. The system further comprises a first multiplexor configured to generate a set of selected decoder circuit outputs by selecting outputs of the first set of decoder circuits based on a first set of leftover bit-counts of a second set of decoder circuits. A second multiplexor is configured to select one decoder circuit output of the set of selected decoder circuit outputs based on a second leftover bit-count of a third set of decoder circuits, and output the at least one decoded symbol and the new leftover bit-count corresponding to the selected one decoder circuit output.

In an embodiment of the foregoing system, a third multiplexor is configured to select a second decoder circuit output of a second set of selected decoder circuit outputs of the second set of decoder circuits based on the second leftover bit-count of the third set of decoder circuits.

In an embodiment of the foregoing system, the first set of decoder circuits and the second set of decoder circuits are parallel sets of decoder circuits, and each decoder circuit of the second set of decoder circuits has a same respective fixed leftover bit-count as a corresponding decoder circuit of the first set of decoder circuits.

In an embodiment of the foregoing system, each first leftover bit-count of the second set of decoder circuits comprises a count of bits leftover after a corresponding decoder circuit of the second set of decoder circuits decodes the first prior fixed length word and a second prior fixed length word based on its respective fixed leftover bit-count.

In an embodiment of the foregoing system, each decoder circuit of the third set of decoder circuits has the same respective fixed leftover bit-count as a corresponding decoder circuit of the first set of decoder circuits.

In an embodiment of the foregoing system, the second leftover bit-count comprises a count of bits leftover after each decoder circuit of the third set of decoder circuits decodes a second prior fixed length word and a third prior fixed length word of the series of fixed length words.

In an embodiment of the foregoing system, the second leftover bit-count is selected from decoder circuit outputs of the third set of decoder circuits.

In an embodiment of the foregoing system, the variable length code is a prefix code.

In an embodiment, a method for decoding variable-length codes in a parallel process comprises dividing a stream of variable-length code words into a series of fixed length words, where each of the fixed length words comprising at least a portion of an encoded symbol. At each of a plurality of parallel sets of decoder circuits, a respective current fixed length word and a respective prior fixed length word from the series of fixed length words is received in parallel. Each decoder circuit of each of the plurality of parallel sets of decoder circuits has a respective fixed leftover bit-count. Each decoder circuit of the plurality of parallel sets of decoder circuits generates a respective output comprising at least one decoded symbol and a new leftover bit-count. Each respective output is determined based on the respective current fixed length word, the respective prior fixed length word, and the respective fixed leftover bit-count. A set of selected decoder circuit outputs is generated for each set of the plurality of parallel sets of decoder circuits, based on a set of first leftover bit-counts of a respective first prior set of the plurality of parallel sets of decoder circuits. One decoder circuit output from each set of selected decoder circuit outputs is selected based on a second prior leftover bit-count. The at least one decoded symbol and the new leftover bit-count of the selected decoder circuit outputs is output for each set of the plurality of parallel sets of decoder circuits.

In the foregoing method, each decoder circuit of each set of decoder circuits has a same respective fixed leftover bit-count as corresponding decoder circuit of each of the other sets of decoder circuits.

In the foregoing method, the second leftover bit-count is selected from decoder circuit outputs of a last set of decoder circuits In the foregoing method, the variable length code is a prefix code.

V. Conclusion

While various embodiments of the present application have been described above, it should be understood that they have been presented by way of example only, and not limitation. It will be understood by those skilled in the relevant art(s) that various changes in form and details may be made therein without departing from the spirit and scope of the application as defined in the appended claims. Accordingly, the breadth and scope of the present application should not be limited by any of the above-described exemplary embodiments, but should be defined only in accordance with the following claims and their equivalents.

What is claimed is:

1. A method for decoding variable-length codes in a parallel process, the method comprising:
   dividing a stream of variable-length code words into a series of fixed length words, each of the fixed length words comprising at least a portion of an encoded symbol;
   receiving, at a first set of decoder circuits, a first fixed length word and a first prior fixed length word from the series of fixed length words, each decoder circuit of the first set of decoder circuits having a respective fixed leftover bit-count;
   generating, by each decoder circuit of the first set of decoder circuits, a respective output comprising a decoding result and a new leftover bit-count, each respective output determined based on the first fixed length word, the first prior fixed length word, and the respective fixed leftover bit-count;
   generating a set of selected decoder circuit outputs by selecting outputs of the first set of decoder circuits based on a set of first leftover bit-counts of a second set of decoder circuits;
   selecting one decoder circuit output of the set of selected decoder circuit outputs based on a second leftover bit-count of a third set of decoder circuits; and
   outputting the decoding result and the new leftover bit-count corresponding to the selected one decoder circuit output.

2. The method of claim 1 further comprising, selecting a second decoder circuit output of a second set of selected decoder circuit outputs of the second set of decoder circuits based on the second leftover bit-count of the third set of decoder circuits.

3. The method of claim 1, wherein the first set of decoder circuits and the second set of decoder circuits are parallel sets of decoder circuits, and each decoder circuit of the second set of decoder circuits has a same respective fixed leftover bit-count as a corresponding decoder circuit of the first set of decoder circuits.

4. The method of claim 3, wherein each first leftover bit-count of the second set of decoder circuits comprises a count of bits leftover after a corresponding decoder circuit of the second set of decoder circuits decodes the first prior fixed length word and a second prior fixed length word based on its respective fixed leftover bit-count.

5. The method of claim 1, wherein each decoder circuit of the third set of decoder circuits has the same respective fixed leftover bit-count as a corresponding decoder circuit of the first set of decoder circuits.

6. The method of claim 5, wherein the second leftover bit-count comprises a count of bits leftover after each decoder circuit of the third set of decoder circuits decodes a second prior fixed length word and a third prior fixed length word of the series of fixed length words.

7. The method of claim 6, wherein the second leftover bit-count is selected from decoder circuit outputs of the third set of decoder circuits.

8. The method of claim 1, wherein the variable length code is a prefix code.

9. A system for decoding variable-length codes in a parallel process, the system comprising:
one or more processors; and
one or more memory devices that store program code to be executed by the one or more processors, the program code comprising:
a bit stream preprocessor configured to divide a stream of variable-length code words into a series of fixed length words, each of the fixed length words comprising at least a portion of an encoded symbol;
a first set of decoder circuits, each decoder circuit of the first set of decoder circuits having a respective fixed leftover bit-count, and each decoder circuit configured to:
receive a first fixed length word and a first prior fixed length word from the series of fixed length words; and
generate a respective output comprising a decoding result and a new leftover bit-count, each respective output determined based on the first fixed length word, the first prior fixed length word, and the respective fixed leftover bit-count;
a leftover bit-count propagator configured to:
generate a set of selected decoder circuit outputs by selecting outputs of the first set of decoder circuits based on a set of first leftover bit-counts of a second set of decoder circuits; and
a system output selector configured to:
select one decoder circuit output of the set of selected decoder circuit outputs based on a second leftover bit-count of a third set of decoder circuits; and
output the decoding result and the new leftover bit-count corresponding to the selected one decoder circuit output.

10. The system of claim 9, comprising a second system output selector, the second system output selector configured to:
select a second decoder circuit output of a second set of selected decoder circuit outputs of the second set of decoder circuits based on the second leftover bit-count of the third set of decoder circuits.

11. The system of claim 9, wherein the first set of decoder circuits and the second set of decoder circuits are parallel sets of decoder circuits, and each decoder circuit of the second set of decoder circuits has a same respective fixed leftover bit-count as a corresponding decoder circuit of the first set of decoder circuits.

12. The system of claim 11, wherein each first leftover bit-count of the second set of decoder circuits comprises a count of bits leftover after a corresponding decoder circuit of the second set of decoder circuits decodes the first prior fixed length word and a second prior fixed length word based on its respective fixed leftover bit-count.

13. The system of claim 9, wherein each decoder circuit of the third set of decoder circuits has the same respective fixed leftover bit-count as a corresponding decoder circuit of the first set of decoder circuits.

14. The system of claim 13, wherein the second leftover bit-count comprises a count of bits leftover after each decoder circuit of the third set of decoder circuits decodes a second prior fixed length word and a third prior fixed length word of the series of fixed length words.

15. The system of claim 14, wherein the second leftover bit-count is selected from decoder circuit outputs of the third set of decoder circuits.

16. The system of claim 9, wherein the variable length code is a prefix code.

17. A method for decoding variable-length codes in a parallel process, the method comprising:
dividing a stream of variable-length code words into a series of fixed length words, each of the fixed length words comprising at least a portion of an encoded symbol;
receiving in parallel, at each of a plurality of parallel sets of decoder circuits, a respective current fixed length word and a respective prior fixed length word from the series of fixed length words, each decoder circuit of each of the plurality of parallel sets of decoder circuits having a respective fixed leftover bit-count;
generating, by each decoder circuit of the plurality of parallel sets of decoder circuits, a respective output comprising a decoding result and a new leftover bit-count, each respective output determined based on the respective current fixed length word, the respective prior fixed length word, and the respective fixed leftover bit-count;
generating a set of selected decoder circuit outputs for each set of the plurality of parallel sets of decoder circuits, based on a set of first leftover bit-counts of a respective first prior set of the plurality of parallel sets of decoder circuits;
selecting one decoder circuit output from each set of selected decoder circuit outputs based on a second prior leftover bit-count; and
outputting the decoding result and the new leftover bit-count of the selected decoder circuit outputs for each set of the plurality of parallel sets of decoder circuits.

18. The method of claim 17, wherein each decoder circuit of each set of decoder circuits has a same respective fixed leftover bit-count as corresponding decoder circuit of each of the other sets of decoder circuits.

19. The method of claim 17, wherein the second leftover bit-count is selected from decoder circuit outputs of a last set of decoder circuits.

20. The method of claim 17, wherein the variable length code is a prefix code.

\* \* \* \* \*